(12) United States Patent
Milenkovic et al.

(10) Patent No.: US 8,483,625 B2
(45) Date of Patent: Jul. 9, 2013

(54) TRANSCEIVERS

(75) Inventors: Srdjan Milenkovic, Woking (GB);
Danny Webster, Haslemere (GB);
Ebrahim Bushehri, Ealing (GB);
Rišard Kurylo, Vilnius (LT)

(73) Assignee: Lime Microsystems Limited, Haslemere (GB)

(\*) Notice: Subject to any disclaimer, the term of this patent is extended or adjusted under 35 U.S.C. 154(b) by 701 days.

(21) Appl. No.: 12/376,550

(22) PCT Filed: Jul. 16, 2007

(86) PCT No.: PCT/GB2007/002683
§ 371 (c)(1),
(2), (4) Date: May 9, 2010

(87) PCT Pub. No.: WO2008/017805
PCT Pub. Date: Feb. 14, 2008

(65) Prior Publication Data
US 2011/0136443 A1  Jun. 9, 2011

(30) Foreign Application Priority Data
Aug. 5, 2006  (GB) .................... 0615567.5

(51) Int. Cl.
*H04B 1/40* (2006.01)

(52) U.S. Cl.
USPC ............ 455/76; 455/197.1; 455/84; 455/131; 455/179.1; 455/226.1; 455/180.3; 455/67.11; 341/143; 341/156; 341/144; 375/141; 375/377; 708/271; 708/276; 708/270

(58) Field of Classification Search
USPC ............... 455/197.1, 84, 131, 179.1, 226.1, 455/180.3, 67.11; 341/143, 156, 144; 375/141, 375/377; 708/271, 276, 270
See application file for complete search history.

(56) References Cited

U.S. PATENT DOCUMENTS 5,999,581 A * 12/1999 Bellaouar et al. ............. 375/377
6,271,782 B1 * 8/2001 Steensgaard-Madsen .... 341/143

(Continued)

FOREIGN PATENT DOCUMENTS

| WO | WO9836501 A | 8/1998 |
| WO | WO2004088843 A | 10/2004 |
| WO | WO2006041674 A | 4/2006 |
| WO | WO2007140951 A | 12/2007 |

OTHER PUBLICATIONS

Ivanin I. S., "Method for Investigating the Spectral Characteristics of Digital Synthesizers for Multilevel Signals," Radio Electronics and Communication Systems, Allerton Press, Inc., New York, NY, U.S., vol. 32, No. 12, 1989, pp. 83-85.

(Continued)

*Primary Examiner* — April G Gonzales
(74) *Attorney, Agent, or Firm* — Smith Risley Tempel Santos LLC; Robert A. Blaha

(57) ABSTRACT

An RF transceiver apparatus comprises transmitter circuitry arranged to convert signals from a baseband frequency to RF transmission frequencies and receiver circuitry arranged to convert signals from RF reception frequencies to the baseband frequency. The transmitter and receiver circuitry each comprise three mixers arranged to convert a signals between the baseband frequency, a first intermediate frequency; a second intermediate frequency that is higher than the transmission frequencies; and a second intermediate frequency to the transmission frequency.

18 Claims, 16 Drawing Sheets

U.S. PATENT DOCUMENTS

| | | | | |
|---|---|---|---|---|
| 6,347,325 B1* | 2/2002 | Ribner et al. | 708/271 |
| 6,587,863 B1* | 7/2003 | Gentile et al. | 708/276 |
| 6,591,091 B1* | 7/2003 | Vorenkamp et al. | 455/179.1 |
| 6,639,531 B1 | 10/2003 | Melanson | |
| 6,952,564 B2* | 10/2005 | Gannholm | 455/84 |
| 7,358,881 B2* | 4/2008 | Melanson | 341/144 |
| 7,620,095 B2* | 11/2009 | Ben-Bassat | 375/141 |
| 2003/0194978 A1* | 10/2003 | Vorenkamp et al. | 455/197.1 |
| 2005/0164648 A1* | 7/2005 | Gannholm | 455/84 |
| 2005/0164662 A1* | 7/2005 | Tseng et al. | 455/131 |
| 2007/0018866 A1* | 1/2007 | Melanson | 341/143 |
| 2007/0291823 A1* | 12/2007 | Ben-Bassat | 375/141 |

OTHER PUBLICATIONS

Chen B. D. et al., "Waveform Synthesis Via Inverse Walsh Transform," International Journal of Electronics, Taylor and Francis, London, GB, vol. 48, No. 3, 1980, pp. 243-256.

Rudi De Buda, "Frequency Synthesis Using Walsh Functions," IEEE Transactions on Electromagnetic Compatability, IEEE Service Center, New York, NY, U.S., vol. EMC-10, No. 3, Aug. 1979, pp. 269-274.

Matyushin O. T., "A Digital Frequency Synthesizer Which Uses Walsh Functions," Radio Engineering and Electronics Physics, vol. 27, No. 7, Jul. 1982, p. 47.

* cited by examiner

TRANSCEIVERS

FIELD OF THE INVENTION

This invention relates to wireless transmitters and receivers (transceivers). More particularly, the invention concerns broadband multi-standard transceivers using multistage transceiver architecture.

BACKGROUND TO THE INVENTION

The proliferation of mobile communication devices including mobile phones, personal digital assistants (PDAs) and laptops has resulted in significant efforts to provide efficient wireless transmission through adoption of new standards, hardware improvements and more sophisticated network management. As a result, there has been an ever increasing pressure to reduce cost, size and power consumption of such systems. This has driven designers to develop transceivers with higher levels of integration with much of the work focused on replacing the external components with integrated counterparts. This is not a trivial matter and often necessitates design of completely new transceiver architectures to achieve fewer off chip components.

On the other hand the quest for connectivity anytime and anywhere has created the need for more than one transceiver to be incorporated into a single device so that transmission can be achieved over multiple air interfaces and frequency bands. Hence, numerous solutions have been adopted to deploy multiplicity of transceivers using technologies such as multichip modules and multidie packages. Unfortunately, these approaches tend to introduce a significant amount of redundancy and reduced reliability, require more die area for each additional transceiver, and draw additional current leading to more power dissipation, large form factor and excessive bill of materials.

On this basis a fully integrated transceiver covering a heterogeneous set of mobile standards has been one of the major challenges facing the designers. The transceiver architectures used in the prior art can be categorized as one of the configurations of High IF (Superheterodyne), Zero-IF (Homodyne), Low-IF and combinations thereof. The Superheterodyne architecture is based on an Intermediate Frequency (IF) which lies between the baseband and RF transmit and receive frequencies. The IF frequency can be typically fixed anywhere between a few tens of kHz to hundreds of MHz, depending on the bandwidth and required RF frequency. In this architecture channel selection is achieved at a first IF requiring a local oscillator (LO) synthesizer with low phase noise performance. In addition, an external image filter is required at the IF for which integration is difficult to achieve due to the high specification and large filter component values. On the other hand Zero IF architecture eliminates the external filters by converting the signal directly from baseband to RF and vice versa. A key advantage of this architecture is that only a single synthesizer is required because the IF is eliminated, offering yet another saving in complexity and cost. The implementation, however, suffers from the well known problems caused by LO leakage and DC offset, limiting its application to certain modulation schemes and frequencies. The low-IF architecture has been developed to counteract such issues where IF is positioned at a given frequency. In this architecture, a bandpass filter is required for the channel selection which can be implemented in integrated form; however the poor image rejection due to the limited performance of the on chip components is one of the major drawbacks. The low-IF architecture also utilizes an LO synthesizer with low phase noise performance requirements, posing yet another design challenge.

On this basis, the current transceiver architectures are highly optimized and tuned for a given modulation scheme and frequency band. In order to cover multiple frequency bands and/or standards, several such transceivers need to be deployed which are typically implemented over several ICs.

SUMMARY OF THE INVENTION

In some cases, a transceiver which can conform to a multitude of standards and frequency bands and yet can be implemented with a small form factor, low power and cost effectively can be provided by utilizing the digital technology in such a way so as to ease off the performance requirement of the data converters and the RF components. In other words, rather than applying brute force in either using multiple RF transceivers or an all digital single transceiver, novel algorithms, circuit architectures and careful frequency planning can be used to achieve the lowest complexity and highest level of integration whilst satisfying spurious emission criteria of the applicable standards.

In general, the present invention relates to a broadband transceiver apparatus with an extended frequency range encompassing both circuit architectures and components, both individually and together, which, in some embodiments, provide the capability of transmitting and receiving signals, covering multiple standards (such as GSM, EDGE, CDMA, WCDMA, WiMAX and WiFi) and frequencies.

One aspect of the inventive method is a transceiver architecture consisting of three stage frequency translation from baseband to RF and vice versa. Each stage may consist of local oscillator and mixer followed by an interstage filter. Another aspect of the invention is a Direct Digital Frequency Synthesizer (DDFS) and Digital to Analog Converter (DAC) combination for generating the local oscillator signals for broadband transceivers. Another aspect of the invention is a Direct Digital Frequency Synthesizer based on Walsh transform for the generation of Sine and Cosine signals. Another aspect of the invention is a wide band delta sigma modulator (DSM) applicable to data converters (DAC and ADC) and frequency synthesisers. Another aspect of the invention is the algorithm and circuit architecture for a fully integrated low power DDFS and noise shaped Digital to Analog Converter (DAC), the combination of which can be used as a frequency agile local oscillator for the first frequency translation stage in the inventive transceiver architecture. In another aspect, the invention includes transformerless interconversion from differential quadrature inputs to a frequency shifted single ended output, applicable for any of the up or down conversion stages within the transceiver architecture. Yet another aspect of the invention is a set of printed passive filters applicable to the transceiver architecture allowing for the reliable filtering of the signals at any and or each of the three frequency translation stages.

Some embodiments of the invention include an ultra high Intermediate Frequency (IF) consisting of a high bandwidth and frequency resolution first stage Local Oscillator (LO).

DETAILED DESCRIPTION OF THE PREFERRED EMBODIMENTS

Figure 1:
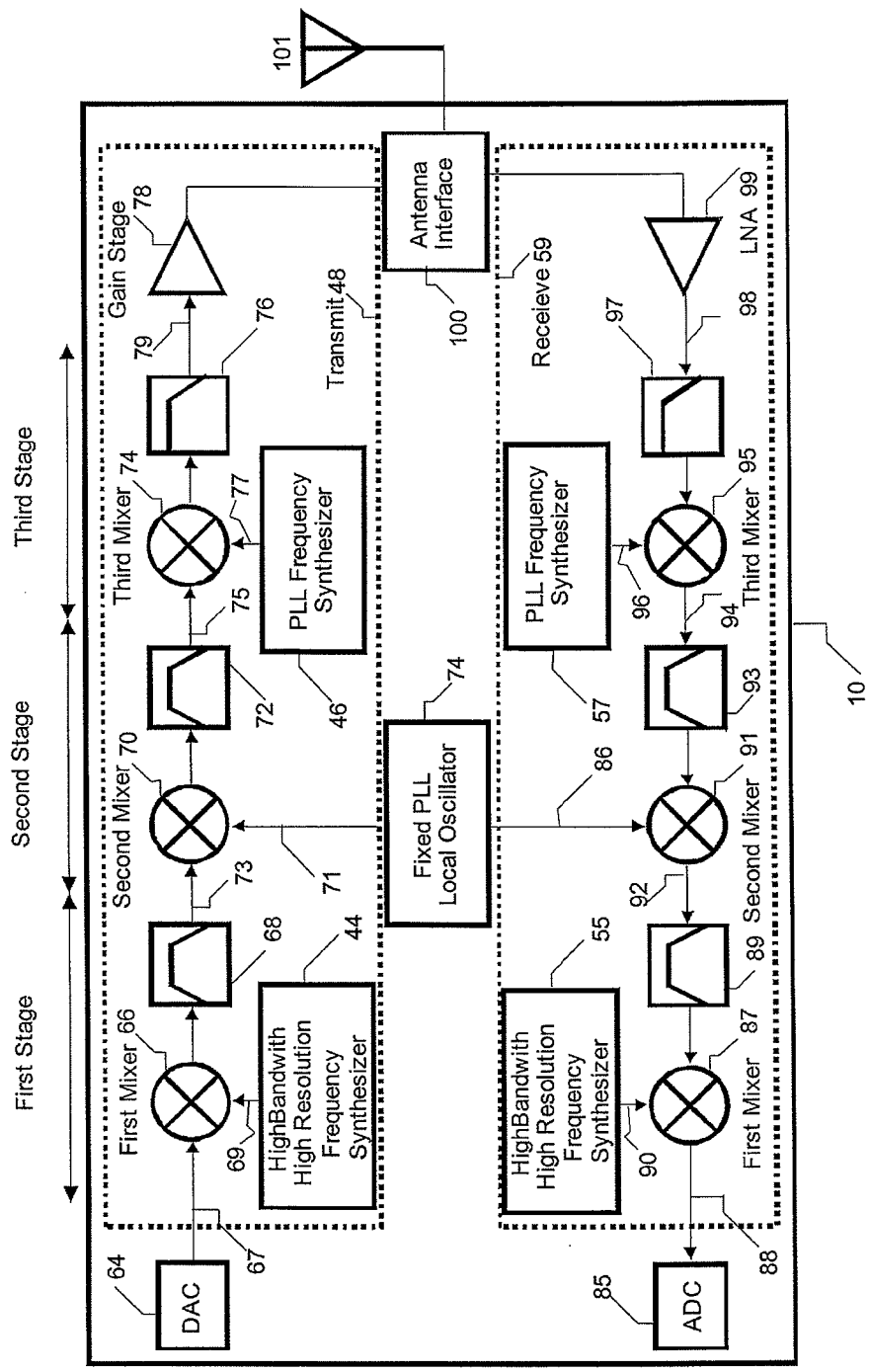
FIG. 1 illustrates a schematic block diagram of a transceiver circuitry in accordance with an embodiment of the present invention.

Embodiments of this invention in part include an architecture and frequency plan so as to achieve high level of integration for multi-band multi-standard transceivers. Additionally, embodiments of this invention in part relates to algorithms and circuit architectures so as to minimize hardware complexity in a preferred implementation. FIG. 1 illustrates a general block diagram of the transceiver circuitry 10 according to an embodiment of this invention. The transceiver consists of two separate paths: a Transmit path 48 that is responsible for frequency up conversion from DAC 64 output to an RF signal 79 driving a gain stage, and a Receive path 59 that is responsible for frequency down conversion from a preconditioned RF signal 98 at the output of LNA 99 to ADC 85 input. Each path consists of three stages namely first, second and third stages.

Considering the transmit circuitry 48, the first stage consists of the first mixer 66 coupled to a band pass filter 68 with the mixer 66 being driven on one side by a high bandwidth, high resolution frequency synthesizer (First Stage Synthesizer) 44, through the analog signal 69 output by the synthesizer 44, and on the other side by a DAC 64, through the analog signal 67 output by the DAC 64. Although not shown, this embodiment may include optional programmable attenuators and filters on signals 67 and 69 for the purpose of power control. The purpose of the first stage is to generate a signal at the first IF 73 which is under the control of the First Stage Synthesizer in terms of frequency agility, range and resolution. The second stage consists of a second Mixer 70 coupled to a band pass filter 72, the mixer 70 being driven by the first intermediate frequency signal 73 and a fixed PLL local oscillator 74 in order to generate the second IF signal 75. The purpose of the second stage Fixed PLL local oscillator is to up convert the first intermediate frequency signal to a suitably high second IF so as to achieve high bandwidth (frequency spread). This makes filtering simpler, and allows the filtering at the second IF to be very efficient, allowing relaxation of the specification on the subsequent third stage for the generation of the final desired RF frequency and range. Similarly the third stage consists of a third Mixer 74 coupled to a low pass filter 76 with the mixer 74 being driven by the second intermediate frequency signal 75 and a PLL Frequency synthesizer 46 for generation of the final RF signal 79. In this embodiment the PLL 46 has a relatively coarse frequency resolution step comparable to the range of the First Stage Synthesizer. The RF signal 79 drives a gain stage 78 for amplification of the signal suitable for transmission. In some embodiments the gain stage 78 may include a gain control circuit.

Considering the receive path 59 briefly, it consists of corresponding circuitry with the same number of stages as the transmit path, the difference being that the signal flow is now reversed from RF 98 to a suitably low frequency signal 88 driving an 85. In this case the third stage consists of a low pass filter 97 and mixer 95 used to convert the RF signal 98 to a high second IF signal 94, being driven by the signal 96, generated by a PLL frequency synthesizer 57. The high second IF signal 94 is converted to a first IF signal 92 through the second stage band pass filter 93 coupled with the second mixer 91, driven by the signal 86 which in turn is generated by the fixed PLL local oscillator 74. The first IF 92 is down converted to a suitably low frequency signal 88 for driving ADC 85. As in the case of the transmit path the first stage mixer 87 is driven by the signal 90 generated from the first stage synthesizer 55 for a frequency agile and high bandwidth reception in the band of interest. An embodiment may include variable gain amplifiers and filters between final mixer 87 and ADC 85. Similarly the broadband LNA 99 may include variable gain circuitry.

At each stage of the transmit and receive paths, the coupled mixer and filter may comprise separate mixer and filter circuitry, or may be formed from circuitry which includes the mixer and filter at least partially integrated together. In either case the function is to convert the frequency of the signal and filter it.

The remaining system of transceiver consists of an antenna 101 and antenna interface 100 which interfaces between the gain stage 78 of the transmit path and the antenna 101, and between the antenna and the LNA 99 of the receive path. The antenna interface 100 may include RF switches, RF filters, circulators, couplers and power control which are not shown in the diagram and a person skilled in the art would understand.

Figure 2:
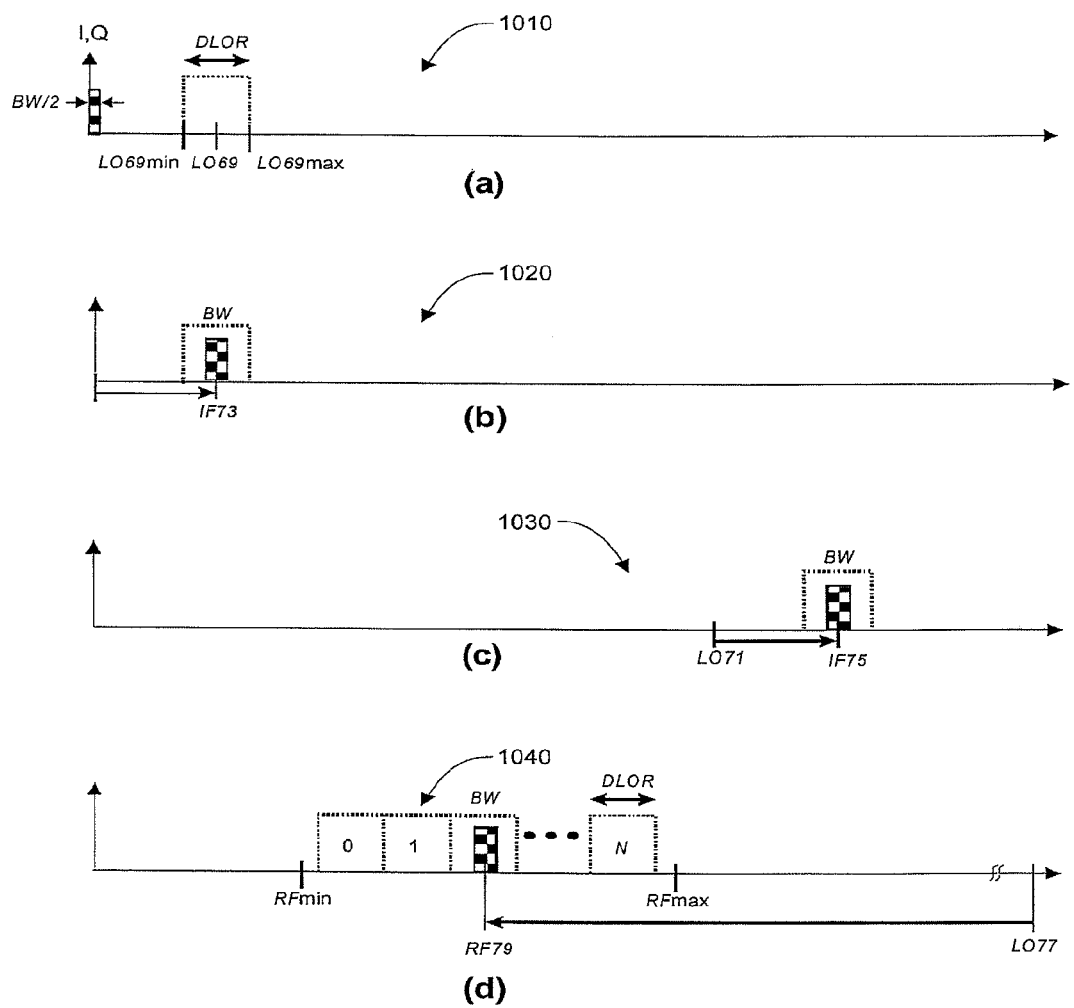
FIG. 2 shows frequency spectra of stages within the transmitter circuitry of FIG. 1.
Figure 3:
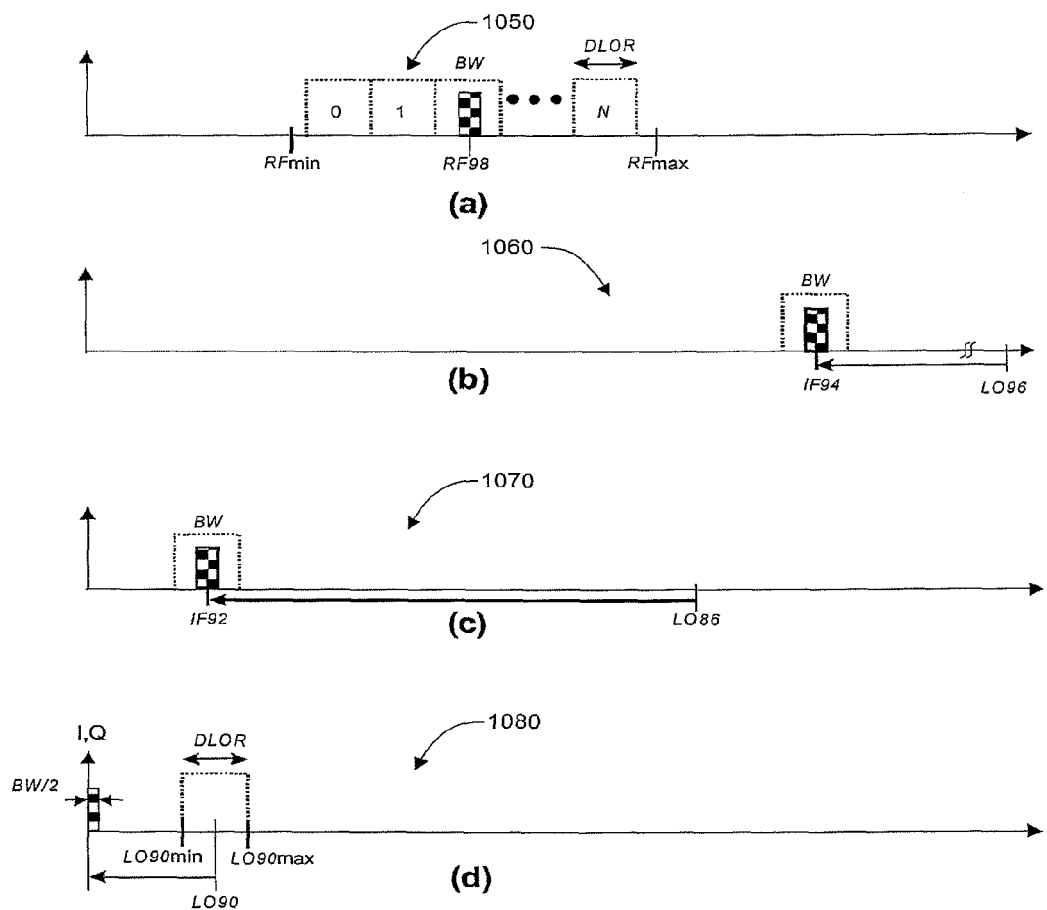
FIG. 3 shows frequency spectra of stages within the receiver circuitry of FIG. 1.

FIGS. 2 and 3 show the frequency plan and the bandwidth coverage of the signals within the transmit and receive paths in the circuitry of FIG. 1, with frequency on the horizontal axis.

Considering the transmit frequency plan, FIG. 2a shows the spectrum 1010 of the baseband signal 67 for up conversion to the desired RF frequency. Spectrum 1020 of FIG. 2b shows the same signal up converted to the first IF 73, according to the formula:

$$IF73 = LO69 \pm BW12, \quad (1)$$

where IF73 is the frequency range of the first IF signal 73, LO69 is the frequency of signal 69 generated by the First Stage Frequency Synthesizer 44 and BW/2 is the bandwidth of the baseband signal 67 coming from the DAC 64. As shown in FIG. 2a, the minimum and maximum frequency range for LO69 are LO69min and LO69max, respectively, given by:

$$LO69\max = LO69\min + DLOR, \quad (2)$$

where DLOR is the frequency range of the First Stage Frequency Synthesizer 44. A key feature of the First Stage Synthesizer 44 is fine frequency resolution, enabling accurate positioning of the baseband signal in the frequency range LO69min and LO69max.

As shown in the spectrum 1030 of FIG. 2c the second stage performs frequency translation from the first IF 73 to the second IF 75, according to the formula:

$$IF75 = LO71 \pm IF73, \quad (3)$$

where IF75 is the frequency of second IF signal 75 from the second stage of the transmit path, LO71 is the frequency of signal 71 generated from the fixed PLL Local Oscillator 74 and IF73 is the first IF 73. Also, the sum or difference in (3) is selected by the Band Pass Filter 72.

FIG. 2d is the spectrum 1040 of the final RF signal 79, obtained according to the formulae:

$$RF79 = LO77 - IF75, LO77 = LO77\min + K \times DLOR, \quad (4)$$

where LO77 is the frequency of output signal 77 from the PLL Frequency Synthesizer 46, IF75 is the frequency of second IF signal 75, LO77min is the minimum frequency of PLL Frequency Synthesizer output 77, where K is an integer variable in the range $0 \leq K \leq N$ and DLOR is the frequency range of the First Stage Frequency Synthesizer 44.

For the transmit 48 to operate according to this embodiment of the invention the following entities apply:

$$LO71 > RF\max, LO77 > RF\max, IF75 > RF\max, \quad (5)$$

where RFmax is maximum frequency of RF signal 79.

Considering the receive 59 frequency plan, FIGS. 3a 1050, 3b 1060, 3c 1070 and 3d 1080 show the spectrum of the received RF signal 98 down converted to baseband signal 88. As in the case of the transmitter, the following entities hold for a receive architecture and frequency plan to operate according to this embodiment of the present invention:

$$IF94 = LO96 - RF98, LO96 = LO96\min + K \times DLOR, \quad (6)$$

where IF94 is the frequency of second IF signal 94 from the third stage of the receive path, LO96 is the frequency of signal 96 generated from the third stage PLL Frequency Synthesizer 57 and RF98 is the frequency of the RF input 98 to the mixer 95 within the third stage of the receive path. LO96min is the minimum frequency of PLL Frequency Synthesizer output 96, K is an integer variable in the range $0 \leq K \leq N$ and DLOR is the frequency range of the First Stage Frequency Synthesizer 55.

$$IF92 = IF94 - LO86 \text{ or } IF92 = LO86 - IF94, \quad (7)$$

where IF92 is the frequency of first stage IF signal 92 from the second stage of the receive path, LO86 is the frequency of signal 86 generated from the fixed PLL Local Oscillator 74 and IF94 is the second IF 94.

$$BB88 = IF92 - LO90, \quad (8)$$

where BB88 is the frequency of the baseband signal 88 output by the mixer 87 to the ADC 85 and LO90 is the frequency of the signal generated by the first stage high bandwidth high resolution frequency synthesizer 55 into the first mixer 87.

$$LO90\max = LO90\min + DLOR, \quad (9)$$

where LO90max and LO90min are the maximum and minimum frequencies of the first stage high bandwidth high resolution frequency synthesizer 55 into the first mixer 87, respectively. DLOR has the same meaning as defined in (6).

$$LO86 > RF\max, LO96 > RF\max, IF94 > RF\max, \quad (10)$$

where RFmax and RFmin are the maximum and minimum frequencies of the signal 98, respectively. IF94 is the frequency of the signal 94 and LO96 is the frequency of PLL Frequency Synthesizer output 96.

As a particular example Table 1 shows a frequency plan according to the invention. The wide band nature of the transmit and receive apparatus according to the invention is evident covering 2.15 to 5.95 GHz range for signals RF79 and RF98. The second staged Fixed PLL local oscillators LO71 and LO86 are set to a fixed frequency of 8 GHz. LO69 and LO90 vary between 0.35 GHz and 0.45 GHz with a frequency resolution determined by the frequency synthesizers 44 and 55, respectively.

TABLE 1

| Transmit 48 | | | | |
| --- | --- | --- | --- | --- |
| LO69 (GHz) | LO71 (GHz) | IF75 (GHz) | LO77 (GHz) | RF79 (GHz) |
| 0.4 | 8 | 8.4 | 14 | 5.6 |
| 0.35 | 8 | 8.35 | 10.6 | 2.25 |
| 0.45 | 8 | 8.45 | 10.6 | 2.15 |
| 0.35 | 8 | 8.35 | 14.3 | 5.95 |
| 0.45 | 8 | 8.45 | 14.3 | 5.85 |

| Receive 59 | | | | |
| --- | --- | --- | --- | --- |
| RF98 (GHz) | LO96 (GHz) | IF94 (GHz) | LO86 (GHz) | LO90 (GHz) |
| 5.6 | 14 | 8.4 | 8 | 0.4 |
| 2.25 | 10.6 | 8.35 | 8 | 0.35 |
| 2.15 | 10.6 | 8.45 | 8 | 0.45 |
| 5.95 | 14.3 | 8.35 | 8 | 0.35 |
| 5.85 | 14.3 | 8.45 | 8 | 0.45 |

The transceiver architecture and the frequency plan according to this embodiment of the invention may advantageously utilize either Fractional N PLL or a DDFS and DAC combination for the implementation of the First Stage Synthesizers 44 and 55. Fractional N PPL has been extensively described in the prior art and is used routinely as a frequency agile LO in transceivers. It may be utilised in generating the LO signals 69 and 90 for the first stage mixers 66 and 87, respectively. In one embodiment of the invention, DDFS DAC combination is used instead of a Fractional N PLL for generation of the LO signals to take advantage of the high frequency resolution, tuning range and stability of DDFS.

Figure 4:
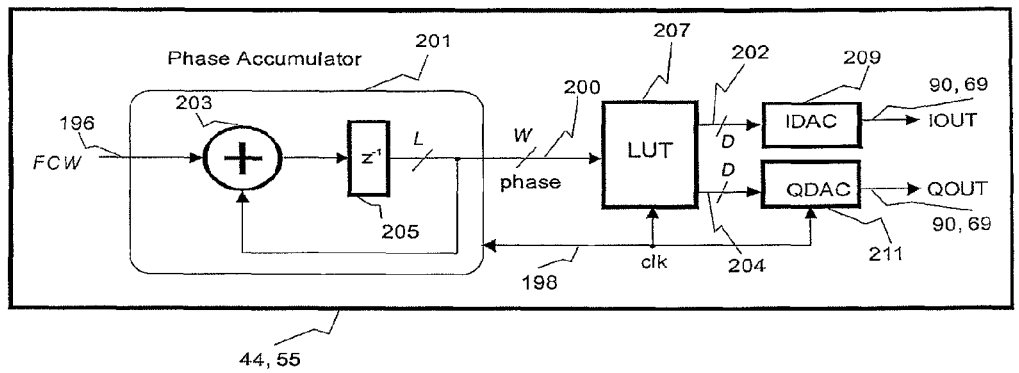
FIG. 4 shows a general block diagram of a Direct Digital Frequency Synthesizer and DAC combination, of the embodiment of FIG. 1.

FIG. 4 shows a general block diagram of the DDFS and DAC combination of this embodiment, which at this level has a structure in common with the prior art. It consists of three main components: a phase accumulator 201, a phase to sine magnitude converter commonly referred to as Look Up Table (LUT) 207 which generates the values of either Sine, Cosine or both and Digital to Analog Converters 209, 211 which convert the digital outputs of from the LUT 207 to analogue sine and cosine signals. Two DACs are used if quadrature signals are required. Although not shown the output of the DACs may be filtered. The phase accumulator 201 is implemented as a digital integrator, consisting of an adder 203 and register 205, which gives rise to a linear change in the signal phase values for generating the Sine or Cosine output.

The DDFS output frequency is defined by frequency control word FCW 196 as follows:

$$f_{out} = \frac{fcw}{2^L} f_{clk} \text{ for } fcw \leq 2^{L-1}, \quad (11)$$

where L is the phase accumulator 201 frequency control word length, i.e. the number of bits in the FCW 196, $f_{clk}$ is the frequency of the clock signal 198 and fcw is the binary value of FCW signal 196. Hence, the output frequency is under the control of the frequency control word and phase accumulator digital word length. This provides high frequency resolution as well as fast frequency switching, depending on the clock frequency.

There are two problems limiting the use of Digital Frequency Synthesizer and DAC combination in the implementation of low power transceivers: frequency of operation and power dissipation, both of which stem from the complexities associated with the LUT and DAC. This is due to the fact that for the high performance transceivers in broadband applications high number of bits (precision) is required to achieve the required performance. This is addressed in this embodiment by the application of novel compression algorithms to the LUT and utilization of noise shaped low bit DAC. The following presents the method by which LUT compression and high bandwidth noise shaping are achieved in order to provide a practical implementation of the transceiver architecture according to this embodiment of the present invention.

Figure 5:
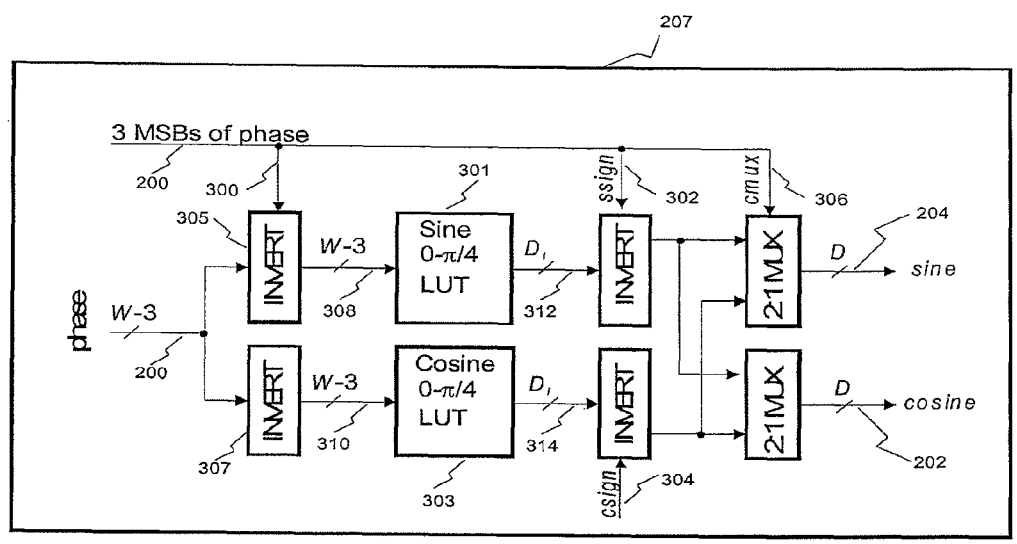
FIG. 5 shows an exemplary implementation of Look Up Table for a Direct Digital Frequency Synthesizer containing one octant of Sine and Cosine samples of the embodiment of FIG. 1.
Figure 6:
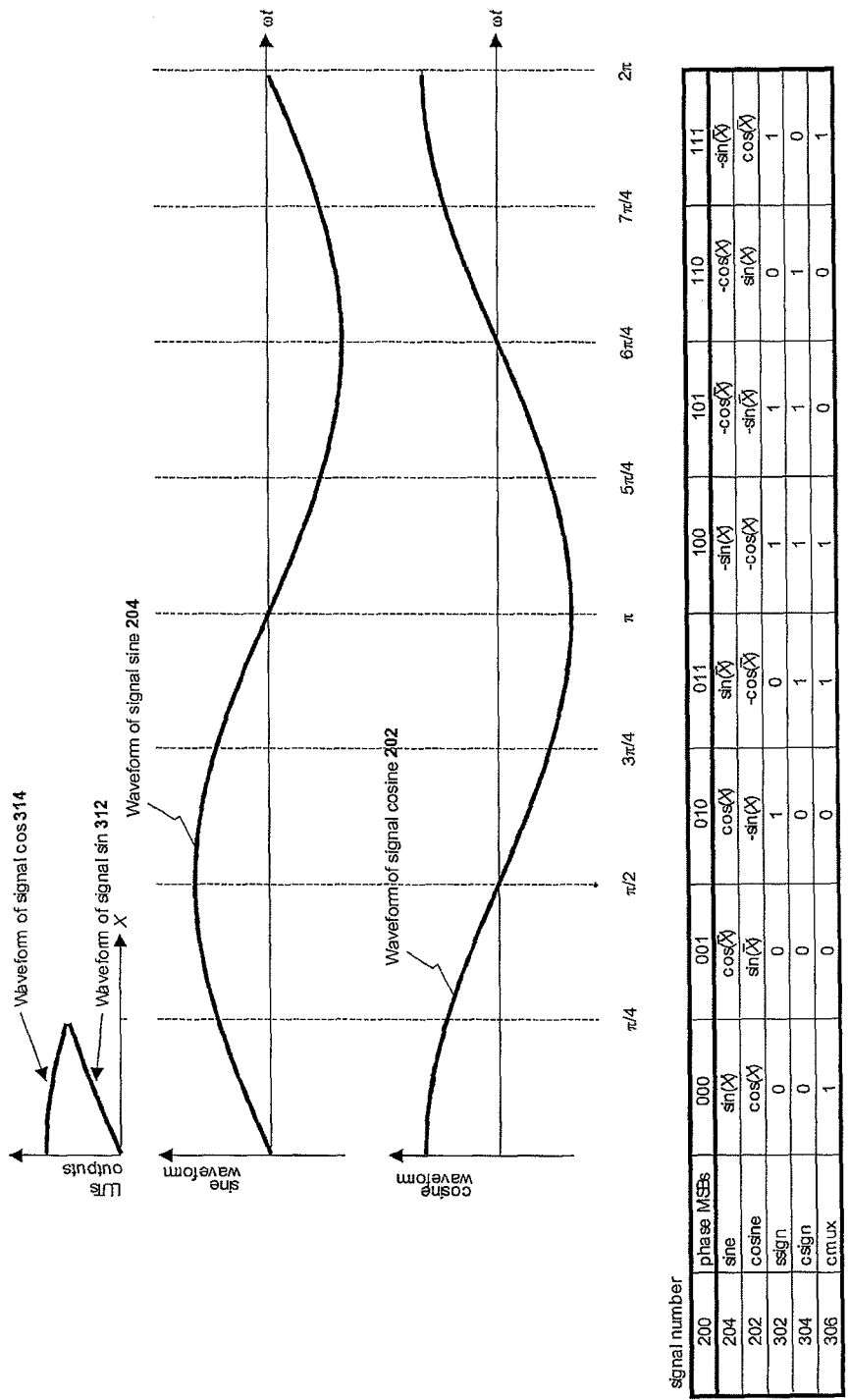
FIG. 6 shows the generation of Quadrature signals using signals which control phase and amplitude inversion, and multiplexer select signal, in the embodiment of FIG. 1.

For a practical implementation the LUT should provide both Sine and Cosine waveforms for quadrature output which results in doubling of the hardware. Instead of using two full Sine and Cosine wave LUTs, the LUTs may only contain one octant of each of Sine and Cosine samples to reduce hardware complexity for which an implementation is shown in FIG. 5. In this case, the three most significant bits (MSBs) of the input phase signal, 200 are used for octant coding. The signals which control phase and amplitude inversion 300, 302, 304 as well as multiplexer select signal 306 are generated according to the phase. Quadrature signals are then generated as illustrated in FIG. 6.

Another method for reducing the size of LUT is by applying compression algorithms, a number of which have been proposed in the prior art. One aspect of the present invention is the application of Walsh functions for the construction of LUT to simplify hardware complexity, a detailed description of which follows.

Walsh functions represent a set of rectangular, +1/−1 valued functions, which are orthogonal to each other, in terms of which Sine and Cosine functions can be expressed.

Walsh functions are derived from a set of Rademacher functions. Rademacher functions consist of a set of waveforms, the first of which is a constant equal to unity within a given period. The next one is a square wave of unity height with the same period. Each successive Rademacher function is a square wave with half the period of the preceding one. All Rademacher functions have an odd symmetry about zero and the point at half the period. This means that the set is incomplete since the sum of any number of functions has odd symmetry about those two points.

The Rademacher functions are combined in a Walsh function in order to construct a complete orthonormal set of rectangular waves. Walsh function $\psi_B(x)$ is defined as the product of Rademacher functions as follows:

$$\psi_B(x) = \psi_{[b_{n-1}b_{n-2} \ldots b_0]}(x) = r_n(x)^{b_{n-1}} \cdot r_{n-1}(x)^{b_{n-2}} \ldots r_1(x)^{b_0}, \quad (12)$$

where $r_n(x)^{b_{n-1}} r_{n-1}(x)^{b_{n-2}} \ldots r_1(x)^{b_0}$ are the Rademacher functions as defined above and $B=[b_{n-1} b_{n-2} \ldots b_0]$ is an n-bit binary number where $b_i$ take binary values of 0 or 1.

Specifically, a Walsh function of index B can be calculated as a product of Rademacher functions which correspond to nonzero bits of index B. For example:

$$\psi_0(x) = r_0(x),$$

$$\psi_1(x) = r_1(x),$$

$$\psi_2(x) = \psi_{[10]}(x) = r_2(x),$$

$$\psi_3(x) = \psi_{[11]}(x) = r_2(x) \cdot r_1(x),$$

$$\psi_4(x) = \psi_{[100]}(x) = r_3(x),$$

$$\psi_5(x) = \psi_{[101]}(x) = r_3(x) \cdot r_1(x).$$

Figure 7:
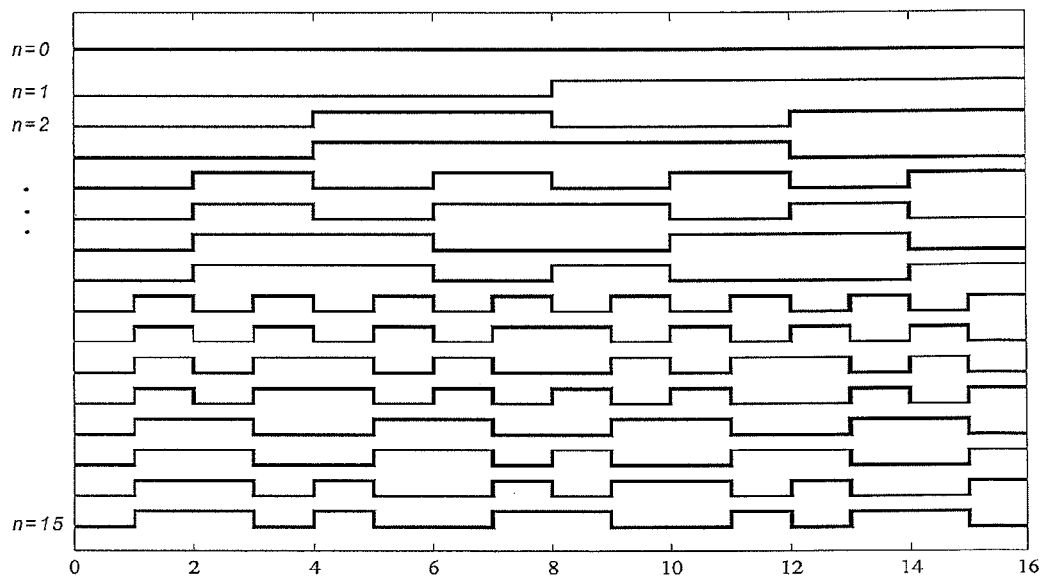
FIG. 7 shows a set of the first sixteen Walsh functions for period T=16.

FIG. 7 shows a set of first sixteen Walsh functions for period T=16. The set contains rectangular functions with both odd and even symmetry about x=0 and x=T/2, hence, Walsh functions form a closed set under multiplication which means multiplication of any two Walsh functions generates another Walsh function. However, the most important property is that the set is orthonormal, hence:

$$\int_0^T \psi_m(x) \psi_n(x) dx = \begin{cases} 0 & \text{for } m \neq n \\ T & \text{for } m = n \end{cases}. \quad (13)$$

Based on the above properties, any function $f(x)$ which can be integrated in the interval $0 \leq x \leq T$ can be expanded in a series of the form:

$$f(x) = \sum_{n=0}^{\infty} c_n \psi_n(x). \quad (14)$$

Combining (13) and (14), the coefficients $c_n$ can be calculated as:

$$c_n = \frac{1}{T} \int_0^T f(x) \psi_n(x) dx. \quad (15)$$

As a person skilled in the art would understand, equations (14) and (15) are similar to Fourier transform pairs. However, these are simple to compute as compared to Fourier transform since Walsh functions are rectangular and multiplications in (14) and (15) are simple to implement in hardware since $\psi_n(x)$ values are limited to +1 or −1 only.

Referring back to FIG. 5, both sine 312 and cosine 314 values are generated for the interval $0$–$\pi/4$. Therefore, the LUTs 301, 303 implement the following functions for both Sine and Cosine respectively:

$$f(x_i) = 2^{D_l-1} \sin\left(\frac{\pi}{4} \frac{x_i + 0.5}{2^{W-3}}\right), x_i = 0, 1, \ldots, 2^{W-3} - 1, \quad (16)$$

$$f(x_i) = 2^{D_I-1}\cos\left(\frac{\pi}{4}\frac{x_i+0.5}{2^{W-3}}\right), x_i = 0, 1, \ldots, 2^{W-3}-1. \quad (17)$$

In the above equations, LUTs 301, 303 are driven by W−3 bit long signals 308, 310 denoted by x, and $D_I$ represents internal data path width which is normally chosen to be greater than final sine and cosine magnitude precision D. A phase offset of 0.5 LSB is added in (16) and (17) formulae so that phase inversion 305, 307 in FIG. 5 can be implemented using simple inverters, as indicated.

Walsh transform coefficients for the sine and cosine functions defined by (16) and (17) can be calculated as follows. First, in order to satisfy the periodicity requirement for the Walsh transform, functions (16) and (17) are considered periodic with the following period:

$$T=2^{W-3}. \quad (18)$$

Then, (14) and (15) can be expressed in discrete form:

$$f(x_i) = \sum_{n=0}^{T-1} c_n \psi_n(x_i), i = 0, 1, \ldots, T-1, \quad (19)$$

$$c_n = \frac{1}{T}\sum_{i=0}^{T-1} f(x_i)\psi_n(x_i), n = 0, 1, \ldots, T-1. \quad (20)$$

For both sine and cosine functions, Walsh coefficients are determined as follows. First, using equation (20), $c_n$ coefficients are calculated, then a threshold of value θ is set. All $c_n$ coefficients less than θ are removed from inverse Walsh equation (19) so that only coefficients≧θ are implemented, which significantly reduces hardware complexity of the LUTs 301, 303.

Figure 8:
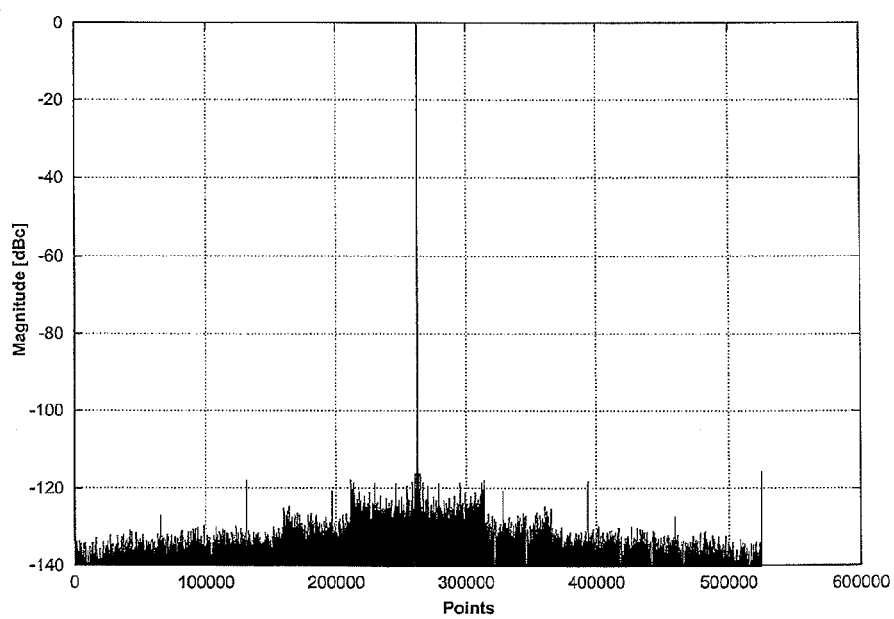
FIG. 8 shows a diagram with the simulated frequency spectrum of a Direct Digital Frequency Synthesizer according to a further embodiment of the invention.

The example below shows the performance achieved in this approach of using Walsh functions for the construction of Sine and Cosine LUTs for frequency synthesis. The parameters used are: phase precision: W=19 bits, internal data path width: $D_I$=20 bits, threshold: θ=2, sine/cosine magnitude precision: D=14 bits, based on which the following results are obtained: number of nonzero $c_n$ sine coefficients: n=102, number of nonzero $c_n$ cosine coefficients: n=92, worst case spur of the output signal: −114.72 dBc. FIG. 8 shows the simulated spectrum of the resulting DDFS configuration, based on the above parameters.

The spurious performance is close to the ideal 14 bit sine (−116 dBc). After truncating 20 bit result of the inverse Walsh transform to 14 bit output signals, spurious performance is fully preserved. Removing all Walsh transform coefficients with the magnitude less than θ=2 has resulted in a reduction of the number of terms in (19) from 65536+65536 to 102+92 which significantly simplifies hardware implementation of quadrature phase to sine magnitude LUTs 301, 303.

Another embodiment uses an algorithm based on a well known Sigma Delta modulator scheme, applicable to both data converters (ADC and DAC) and frequency synthesis. The following presents the algorithm, described in the context of the DAC technology applicable but not limited to the DDFS DAC combination above.

The algorithm results in a simplified construction of DAC by shifting of the complexity from analog to digital domain. This in turn leads to smaller size, power dissipation and high speed, further benefiting from the scaling of the digital technology.

Figure 9:
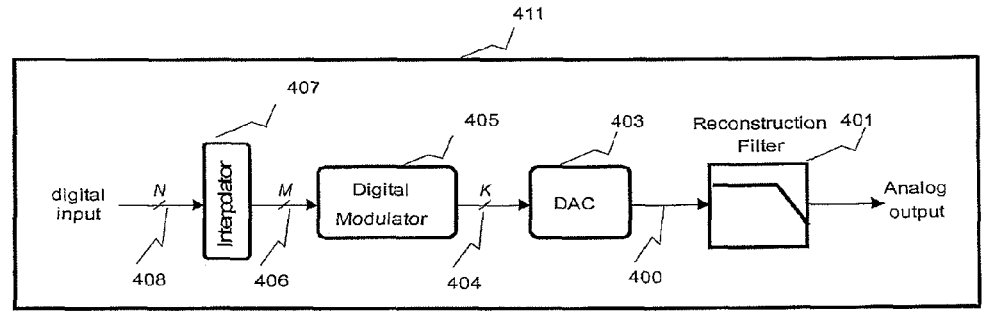
FIG. 9 illustrates a delta sigma modulation process for digital to analog conversion according to an embodiment of the invention.

FIG. 9 illustrates typical delta sigma modulation process for digital to analog conversion, which is also used in this embodiment. Input to the system is digital data 408 N bit wide. Since oversampling converters usually operate at much higher clock frequency than the input data rate, digital input sequence 408 is first converted to higher data rate and the repetitive spectral images are removed by interpolation filters 407 arranged to filter the input. Additionally, the interpolator can increase amplitude precision, producing an M bit output 406 where M≧N. The data is then digitally modulated using a digital modulator 405, arranged to receive as input the output 406 from the interpolator. The output of the modulator 405 is truncated to K bits 404 (K<<M) and used as the input to a DAC 403. The conversion process is completed by filtering the output of the DAC 400, using a reconstruction filter 401 arranged, in the analogue domain, to remove images and out off band noise.

Digital modulator 405 reduces the number of bits from M at the input 406 to K<M output bits 404 while keeping the original input magnitude precision. Truncation noise, generated in this way, is then pushed out of signal band by employing oversampling and noise shaping techniques.

In the z-domain, delta sigma output signal 404 Y(z) can be expressed as a function of two signals, input 406 X(z) and internally generated noise signal 502 E(z) as follows:

$$Y(z)=S(z)X(z)+N(z)E(z). \quad (21)$$

Here, S(z) and N(z) are signal (STF) and noise (NTF) transfer functions, respectively. Based on the above, signal and noise are passed through different filtering functions, which provides a means for filtering of the truncation noise, hence achieving a higher signal to noise ratio. Similarly, since S(z) and N(z) are different, N(z) can be designed so as to push down the noise floor within the signal band while S(z) will have all-pass nature within the same frequency band. Therefore in-band noise is reduced and the overall Signal to Noise Ratio (SNR) or Spurious performance is improved. The noise which is moved out of band is filtered by the Reconstruction filter 401 in FIG. 9.

On this basis, this embodiment comprises the construction of a delta sigma architecture 405 which provides stable NTF with sufficient noise attenuation in the required frequency band while maintaining an all pass amplitude response for the STF.

Figure 10:
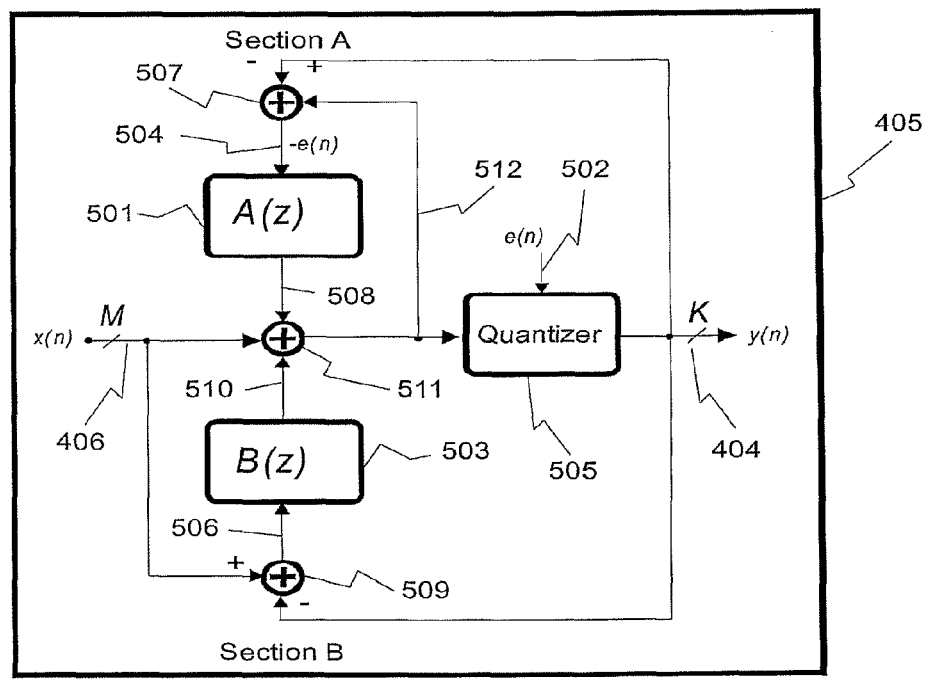
FIG. 10 illustrates a sigma delta noise shaping configuration according to an embodiment of the invention consisting of two loop filters.

FIG. 10 illustrates the configuration of this embodiment consisting of two loop filters A(z) 501 and B(z) 503 which determine the numerator and denominator of the NTF, respectively. The configuration includes a quantizer 505 which produces an output signal y(n). An adder 507 generates the difference between output signal y(n) 404 and the quantizer input 512. Signal 504 which is the output from the adder 507 forms the input to, and is processed by, a filter A(z) 501 which produces an output 508. On the other hand, a second adder 509 generates the difference between the input signal x(n) 406 and quantizer output signal y(n) 404. The output signal 506 from the second adder 509 forms the input to, and is processed by, a filter B(z) 503 which produces output 510. A third adder 511 sums signals 406, 508 and 510 giving the result as the signal 512 which drives the quantizer 505. The input signal 406 is M bit wide with the quantizer input 512 having the same or higher precision. It is important to note that quantizer reduces the number of bits from M in 512 to K bits at the output y(n) 404 (K<M). In this way, quantization noise e(n) 502 is introduced in the output signal 404.

If the quantizer 505 is simply truncating the signal at its input 512 then K most significant bits of 512 are selected and provided as output signal y(n) 404. In this case, adder 507 is not required since signal 504, which is negative of e(n) 502, can be constructed simply by using M−K least significant bits of the quantizer input 512. In fact, these are the bits truncated from signal 512 while generating the output y(n) 404. The same property of truncation based quantizer can be used also to simplify the implementation of adder 509.

In the z-domain, signal and noise transfer functions of the architecture shown in FIG. 10 can be calculated as follows:

$$S(z) = 1 \text{ and } N(z) = \frac{1 - A(z)}{1 + B(z)}. \quad (22)$$

The advantage of such a scheme is evident if finite impulse response (FIR) transfer functions for A(z) and B(z) of the following form are used:

$$A(z) = \sum_{i=1}^{M} a_i z^{-i}, \quad (23)$$

$$B(z) = \sum_{i=1}^{N} b_i z^{-i}, \quad (24)$$

where M and N are filter orders.

Figure 11:
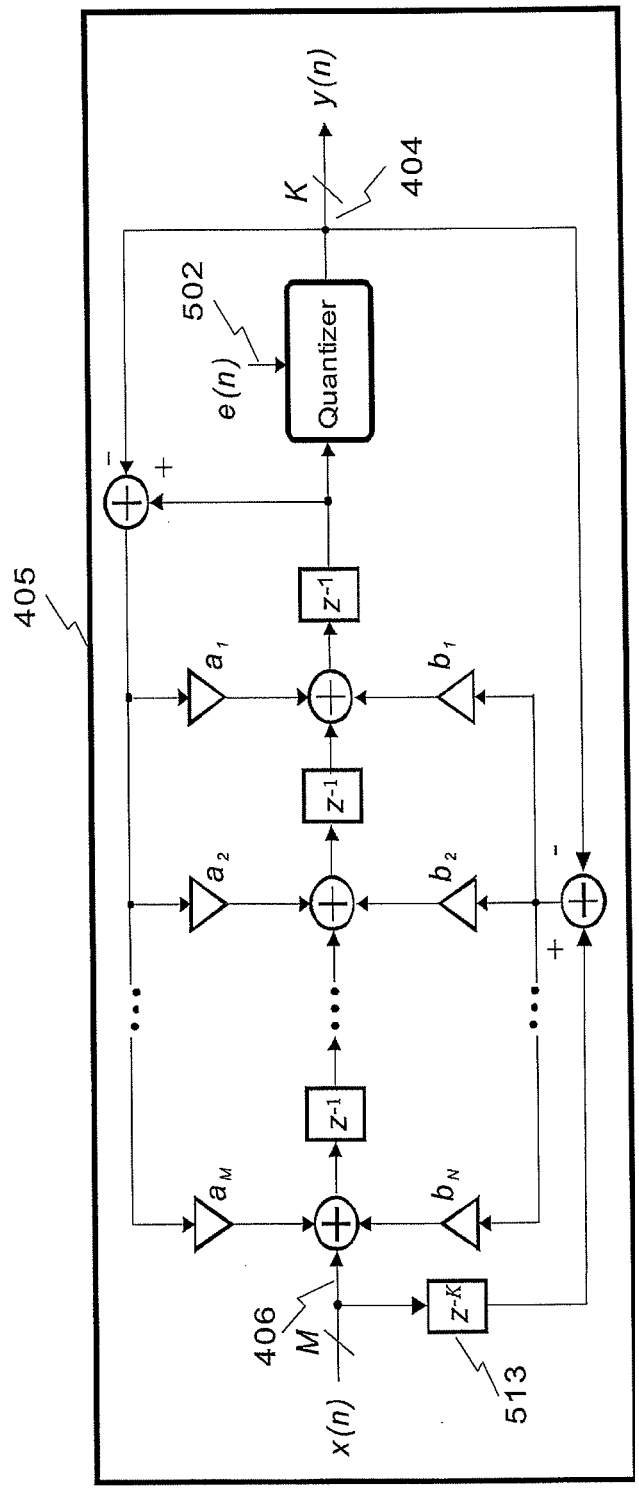
FIG. 11 shows a block diagram of an exemplary implementation of the sigma delta noise shaping architecture of FIG. 10.

Referring to FIG. 11, in an efficient implementation of the architecture in FIG. 10, the filters 501 and 503 share common delay line and tap adders. Specifically a series of tap adders, with a delay line $z^{-1}$ between each adjacent pair of tap adders, is provided between the input x(n) and the quantizer input. A further adder is arranged to generate the difference between the input and output of the quantizer 505 and input the difference to each of a series of coefficient multipliers $a_1$ to $a_M$ each of which is arranged to multiply the output from the further adder by a respective coefficient and input the result to a respective one of the tap adders. This implements the A(z) part of the NTF. A further adder generates the difference between the quantizer output y(n) and the input x(n), after the input x(n) is passed through additional delay registers 513 to compensate for the input signal delay through the shared delay line. The output from this further adder is input via a further series of coefficient multipliers $b_1$ to $b_N$ to respective tap adders. This implements the B(z) part of the NTF. Each tap adder therefore adds the outputs from its two associated coefficient multipliers $a_i$ and $b_i$, one from each of the A(z) and B(z) filter sections, to the output from the previous tap adder in the series. The architecture implements the following signal and noise transfer functions:

$$S(z) = z^{-K} \text{ and } N(z) = \frac{1 - A(z)}{1 + B(z)}, \quad (25)$$

where A(z) and B(z) are given by (23) and (24) and:

$$K = \max(M, N). \quad (26)$$

Signal transfer function (25) is still all-pass while NTF is the same as before.

Figure 12:
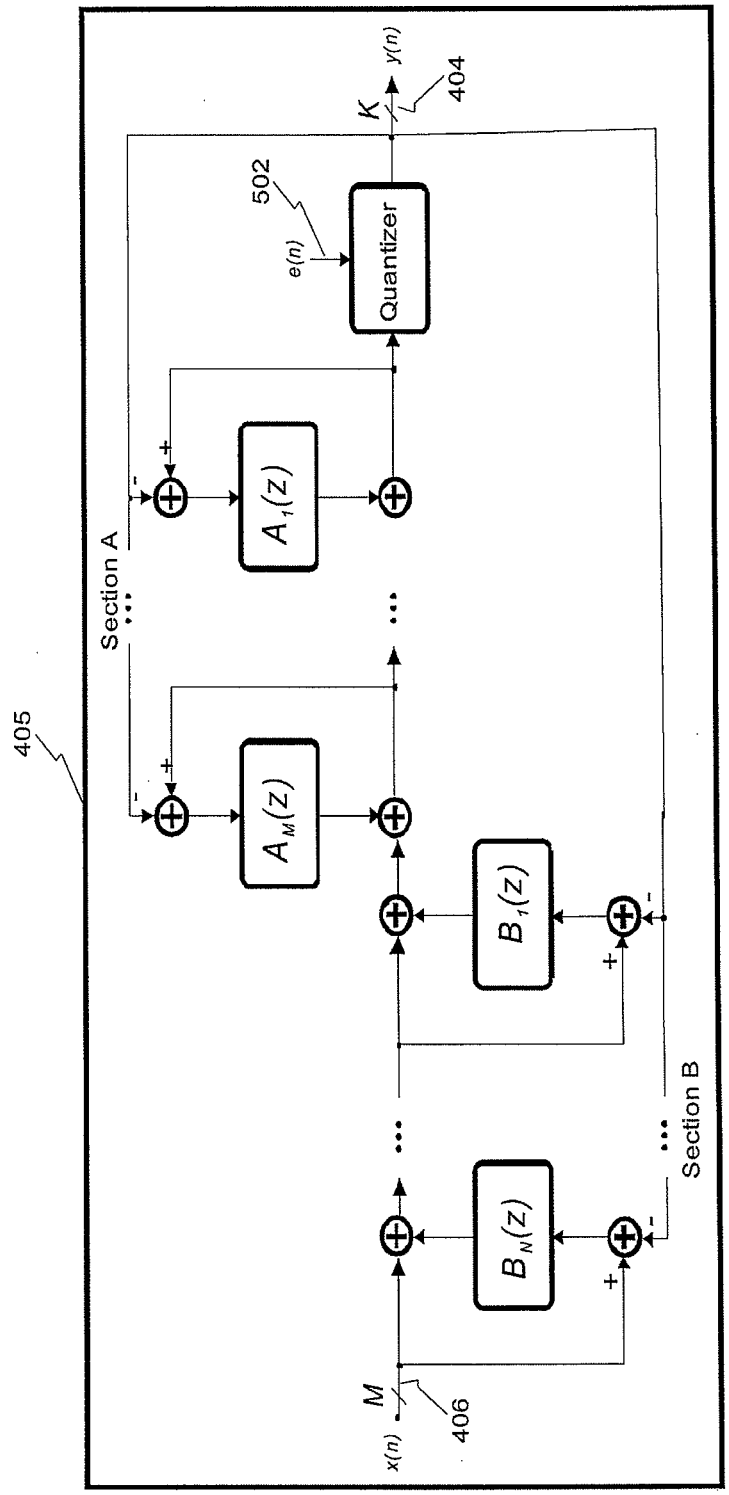
FIG. 12 shows a block diagram of an exemplary multistage configuration of the sigma delta noise shaping architecture of FIG. 10.

One embodiment of the delta sigma modulator of FIG. 10 is shown in FIG. 12. There are M loop filter sub-sections in Section A and N filter sub-sections in Section B. A series of N+M primary adders are provided between the input x(n) and the quantizer 505. The first N primary adders each adds the output from the previous primary adder (or the input x(n) for the first one) to the output from a respective B filter sub-sections, which in turn multiplies the output from a respective difference adder by an appropriate B filter sub-section. Each difference adder generates the difference between the quantizer output and the input to the respective main adder. The subsequent M primary adders each adds the output from a respective A filter sub-section to the output from the previous primary adder. Each of the A filter sub-sections is arranged to generate the difference between the output of the associated primary adder and the quantizer output. Each of the A and B filter sub-sections includes a timing mechanism to control the timing of the feedback in each of the filter sub-sections, in a manner equivalent to the delay lines of FIG. 11. Each of the A filter subsections can be the same as the others, and each of the B filter subsections can be the same as the others. This allows the circuit to be designed and built in a modular manner.

Figure 13:
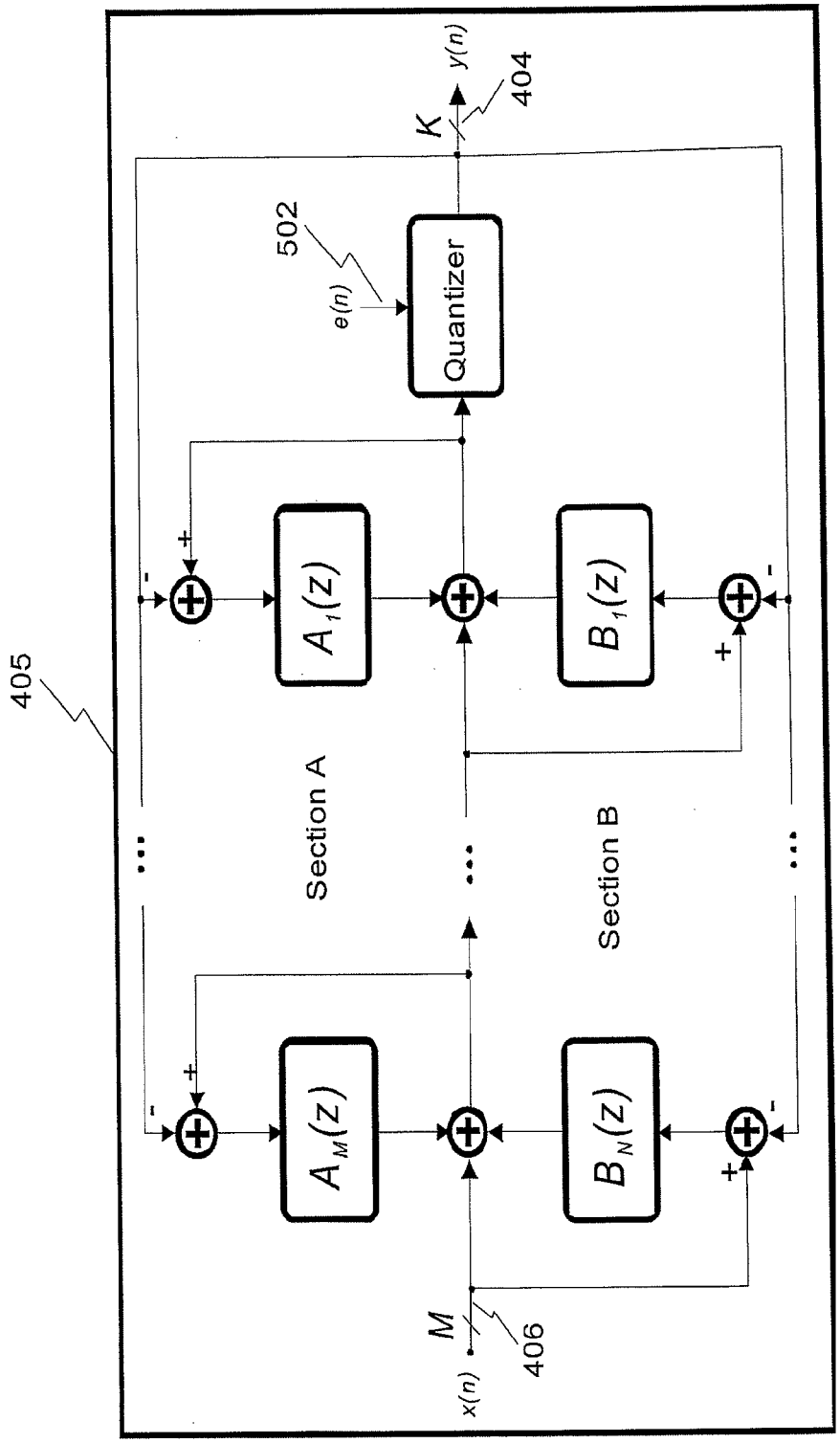
FIG. 13 shows a block diagram of an exemplary multistage configuration of the sigma delta noise shaping architecture of FIG. 10.

A further embodiment of the delta sigma modulator of FIG. 10 is shown in FIG. 13. This embodiment is similar to that of FIG. 12 except that there are M or N main adders, whichever is greater and each of the main adders adds the output from the previous adder with the output of a respective A filter sub-section and a respective B filter sub-section. In the case of M not being equal to N, some of the adders will only have two inputs, number of such adders being equal to the difference between N and M.

Both the architectures of FIGS. 12 and 13 implement the following signal and noise transfer functions:

$$S(z) = 1 \text{ and } N(z) = \frac{\prod_{i=1}^{M}(1 - A_i(z))}{\prod_{i=1}^{N}(1 + B_i(z))}. \quad (27)$$

In the case for which $A_i(z)$ and $B_i(z)$ are restricted to FIR architectures as in (23) and (24), loop filters' stability is guaranteed. On the other hand complex NTF can be implemented as a product of up to second order polynomials in both numerator and denominator. Therefore, stable NTF can be directly mapped into the modulator architecture with up to second order FIR loop filters.

In different embodiments of this invention, six filter configurations suitable for band pass, low pass and high pass delta sigma modulator designs are presented, as presented in the following equations of 33, 34, 35, 36, 37 and 38.

Figure 14:
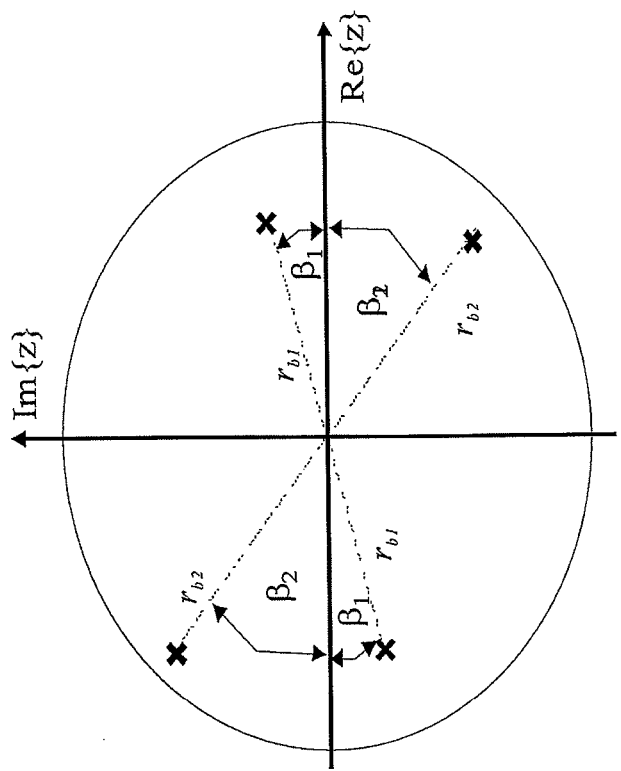
FIG. 14 shows the position of zeros and poles in the z plane providing stop band centre frequency at one quarter of the clock frequency.
Figure 14:
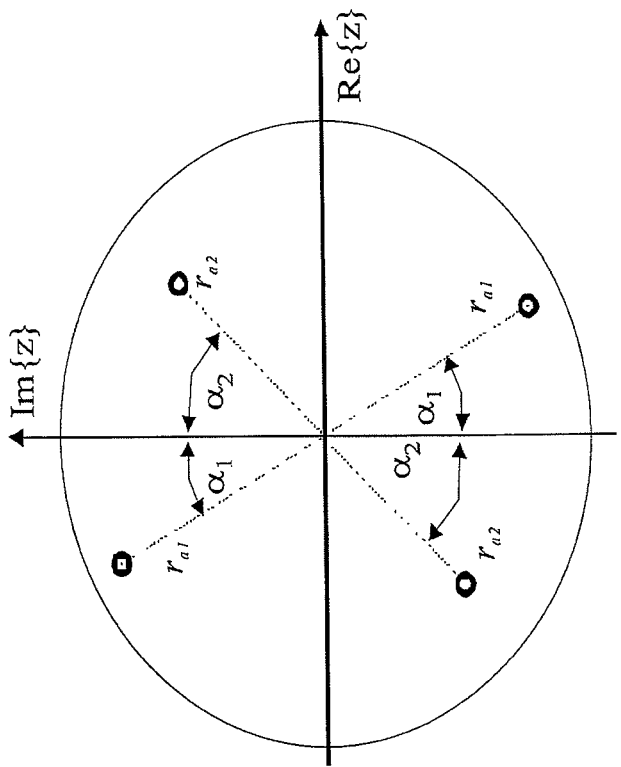

Zeros and poles of (25) are positioned in imaginary z space as shown in the right and left hand plots of FIG. 14 respectively. Specifically two of the poles are located at the two positions in the at radius $r_{a1}$ from the origin and angle $\alpha_1$ from the imaginary axis, and the other two poles are located at the two positions at radius $r_{a2}$ from the origin and angle $\alpha_2$ from the imaginary axis. Two of the zeros are located at the two positions in the at radius $r_{b1}$ from the origin and angle $\beta_1$ from the imaginary axis, and the other two poles are located at the two positions at radius $r_{b2}$ from the origin and angle $\beta_2$ from the imaginary axis. A band stop section with stop band centre frequency $f_c = 0.25 \, f_{clk}$ is achieved, where $f_{clk}$ is the clock frequency. The transfer function of the filter section is given by:

$$H(z) = \frac{1 + a_2 z^{-2} + a_4 z^{-4}}{1 - b_2 z^{-2} + b_4 z^{-4}}, \quad (28)$$

where:

$$a_2 = 2(r_{a1}^2 \cos 2\alpha_1 + r_{a2}^2 \cos 2\alpha_2),$$

$$a_4 = r_{a1}^2 r_{a2}^2 (\cos 2\alpha_1 \cos 2\alpha_2 + \sin 2\alpha_1 \sin 2\alpha_2), b_2 = 2 (r_{b1}^2 \cos 2\beta_1 + r_{b2}^2 \cos 2\beta_2)$$

and $b_4 = r_{b1}^2 r_{b2}^2 (\cos 2\beta_1 \cos 2\beta_2 + \sin 2\beta_1 \sin 2\beta_2)$.

Transfer function for the special case when $r_{a1}=r_{a2}=r_a$, $r_{b1}=r_{b2}=r_b$, $\alpha_1=\alpha_2=\alpha$ and $\beta_1=\beta_2=\beta$ is:

$$H(z) = \frac{1 + 2r_a^2\cos 2\alpha z^{-2} + r_a^4 z^{-4}}{1 - 2r_b^2\cos 2\beta z^{-2} + r_b^4 z^{-4}}. \tag{29}$$

The section order is 4 (the power is −4), but only even terms in H(z) exist (there are no powers of 1 or 3). Thus, hardware requirements are equivalent to second order section. The NTF is composed of two sections of the form (29):

$$N(z)=H_1(z)H_2(z), \tag{30}$$

where the poles and zeros of the sections are defined by:

$$H_1(z): r_a=1, \alpha=\pi/32, r_b=0.7, \beta=\pi/4, \tag{31}$$

$$H_2(z): r_a=1, \alpha=3\pi/32, r_b=0.7, \beta=\pi/4. \tag{32}$$

The resulting noise transfer function is given by:

$$N(z) = H_1(z)H_2(z) = \frac{(1 + 1.96157z^{-2} + z^{-4})}{(1 + 0.2401z^{-4})} \cdot \frac{(1 + 1.66294z^{-2} + z^{-4})}{(1 + 0.2401z^{-4})}. \tag{33}$$

Figure 15A:
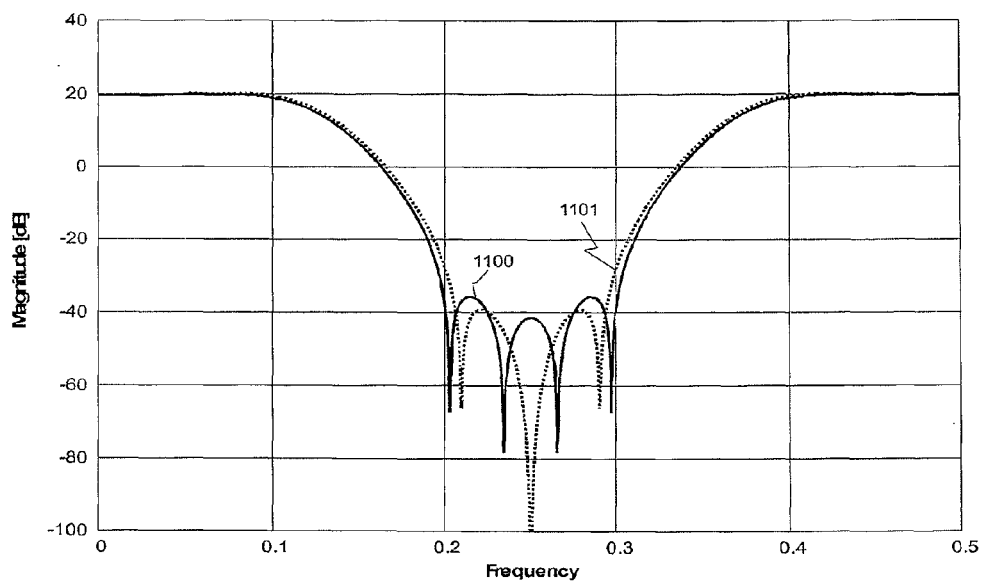
FIG. 15 shows the amplitude response of the band pass Noise Transfer Function of the configuration of FIG. 13 versus normalized frequency.
Figure 15B:
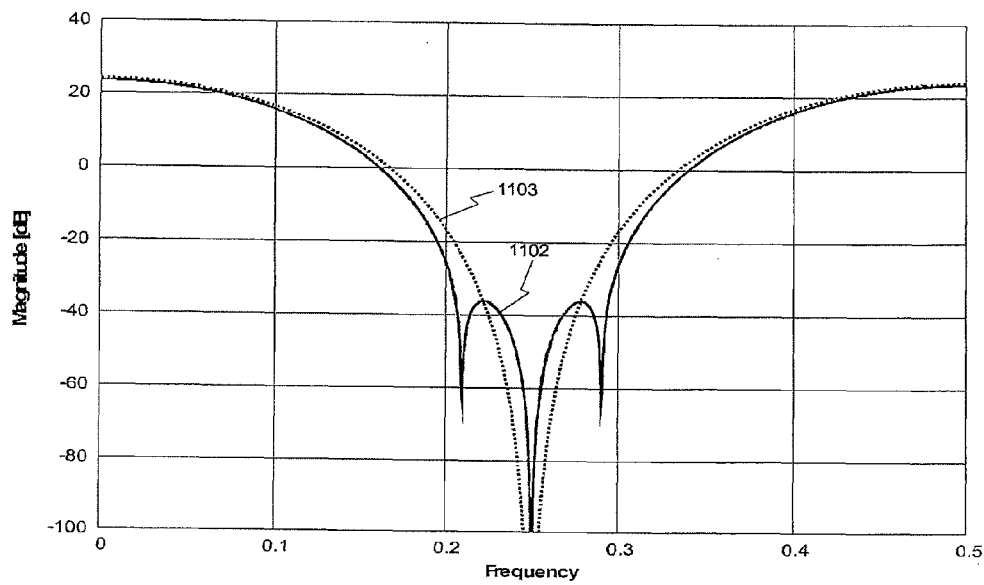

Graph 1100 in FIG. 15 shows the amplitude response of (33) versus normalized frequency. Noise attenuation of more than −60 dB is achieved in the normalized 0.2-0.3 frequency band. This is equivalent to a gain in precession of 10 bits with oversampling ratio of 5.

In another embodiment of this invention, the coefficients of (33) are rounded to have power of two form in which all the numbers can be expressed in terms of powers of two (for example 1.75=2−¼) in order to simplify hardware implementation. The modified noise transfer function is as follows:

$$N(z) = H_1(z)H_2(z) = \frac{(1 + 2z^{-2} + z^{-4})}{(1 + 0.25z^{-4})} \cdot \frac{(1 + 1.75z^{-2} + z^{-4})}{(1 + 0.25z^{-4})}. \tag{34}$$

Graph 1101 of FIG. 15 shows amplitude response of NTF (34).

The poles of noise transfer function are used to reduce out of band gain and provide stable modulator operation. In yet another embodiment of this invention, the poles may be omitted if the modulator architecture can tolerate higher out of band gain. In this case, NTF given by (34) may be further simplified by omitting its denominator, resulting in the following FIR noise transfer function:

$$N(z)=(1+2z^{-2}+z^{-4})\cdot(1+1.75z^{-2}+z^{-4}). \tag{35}$$

FIG. 15, graph 1102 shows amplitude response of the NTF function based on (35). NTF is unconditionally stable and is simple to implement in hardware since the coefficients are power of two.

In yet another embodiment of this invention a simpler band pass modulator may be constructed by using NTF of the form:

$$N(z)=(1+z^{-2})^L \tag{36}$$

Amplitude response of (36) for L=4 is plotted in FIG. 15, graph 1103. For the low pass oversampling modulator, NTF has high pass nature. A high pass filtering function is constructed as follows:

$$N(z)=(1-z^{-1})^L \tag{37}$$

Figure 16:
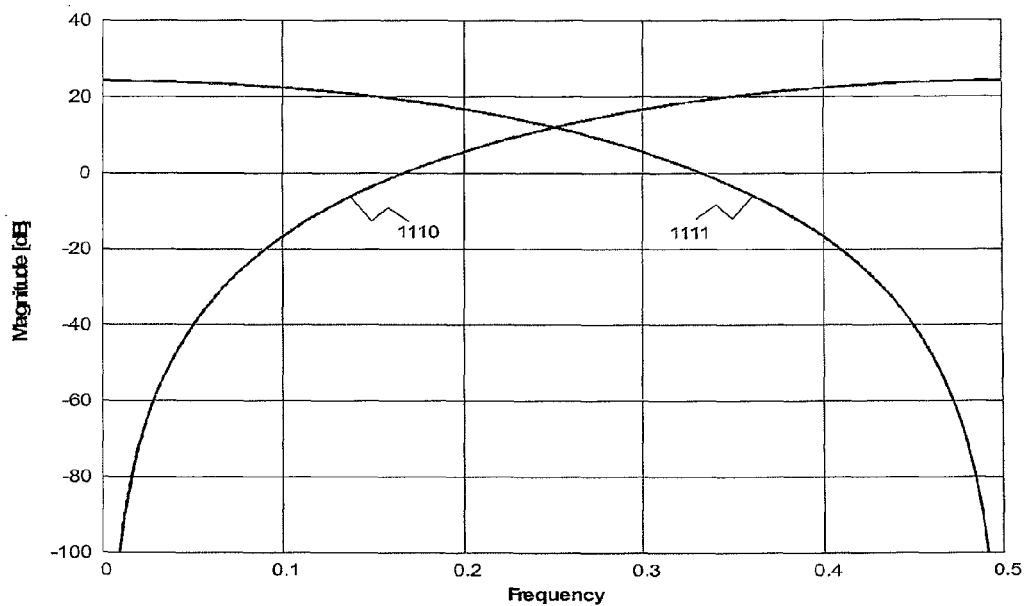
FIG. 16 shows the amplitude response of high and low pass noise transfer functions for low and high pass oversampling modulators, respectively.

The amplitude response of the resulting filtering function for L=4 is given in FIG. 16, graph 1110. In a similar way, an inventive high pass NTF section is constructed as:

$$N(z)=(1+z^{-1})^L \tag{38}$$

FIG. 16, graph 1111 gives amplitude response of the noise transfer function for L=4.

Figure 17:
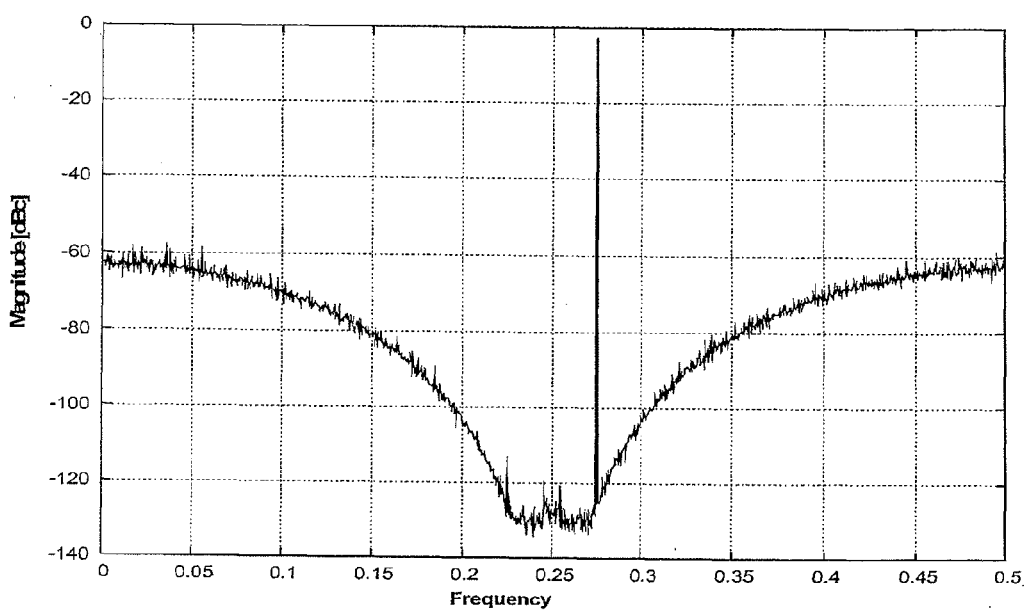
FIG. 17 shows the simulated output spectrum of a band pass delta sigma modulator according to an embodiment of the invention.

FIG. 17 shows the simulated output spectrum of an exemplary band pass delta sigma modulator. The modulator uses noise transfer function (36) for L=4 and is implemented as the architecture given in FIG. 11 with K=6 bit output 404. From (25) and (36), the required loop filter coefficients (23), (24) are calculated as:

$$A(z)=1-(1+z^{-2})^4=4z^{-2}-6z^{-4}-4z^{-6}-z^{-8},$$

$$B(z)=0.$$

Figure 18:
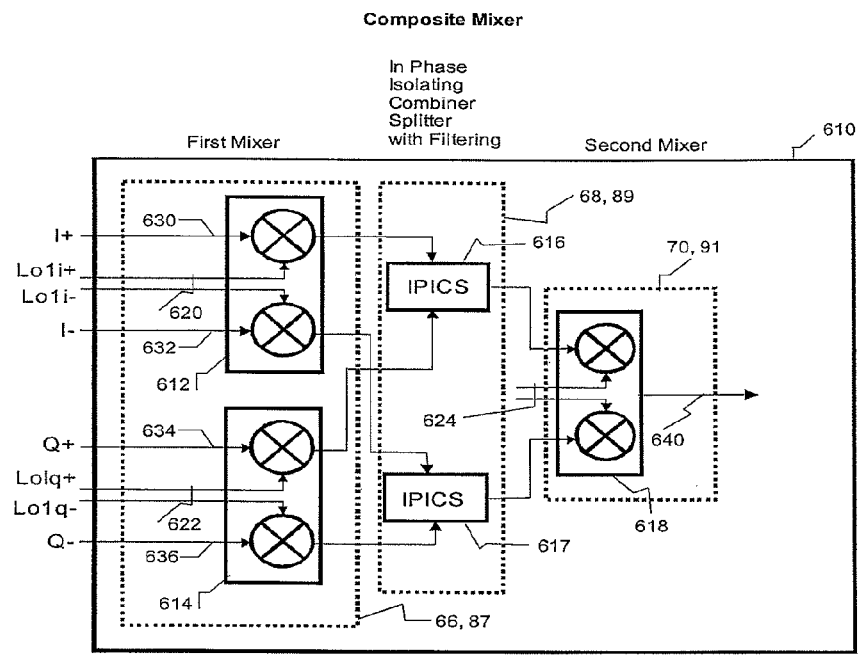
FIG. 18 shows a composite mixer consisting of a first mixer, filter and second mixer combination, according to an embodiment of the invention.

One embodiment of the transceiver 10 in FIG. 1, allows the combination of the first mixer 66, filter 68 and second mixer 70 within the transmit block 48 to form a composite mixer 610 as shown in FIG. 18. Similarly first mixer 87, filter 89 and second mixer 91 within the receive block 59 can also be embodied as a composite mixer 610.

The composite mixer 610 provides transformerless inter-conversion between differential quadrature terminals/ports (630, 632, 634, 636) and a frequency shifted single ended RF terminal/port 640. The system consists of 3 doubly balanced frequency mixers 612, 614 and 618 joined together through In Phase Isolating Combiner Splitters (IPICS) 616 and 617. The RF terminal 640 may include filtering to uniquely select either sideband. The doubly balanced frequency mixers can be any kind such as diode, resistive FET, BJT or Gilbert Cell. The IPICS 616 and 617, can be any kind according to the prior art, including but not limited to embodiments of Wilkinson Combiners (including both distributed or lumped) or active circuits including FETs, BJTs such as the embodiment 650 shown in FIG. 19.

Mixers 612 and 614 are driven directly or indirectly from a differential local oscillator (which are embodiments of 44 or 55) through the differential signal paths 620 and 622, where 620 and 622 have a quadrature relationship to one another. The mixer 612 therefore produces as output differential I outputs and the mixer 614 produces as output differential Q outputs. The positive outputs from the two mixers 612 and 614 are both input to one of the IPICS 616, and the negative outputs are both input to the other of the IPICS 617. The outputs from the two IPICS are input to the mixer 618 which is driven directly or indirectly from a differential local oscillator (which is an embodiment of 74) through the differential signal path of 624. Depending on the technology used, the system 610 can be either unidirectional or bidirectional, giving either up or down conversion or both.

Figure 19:
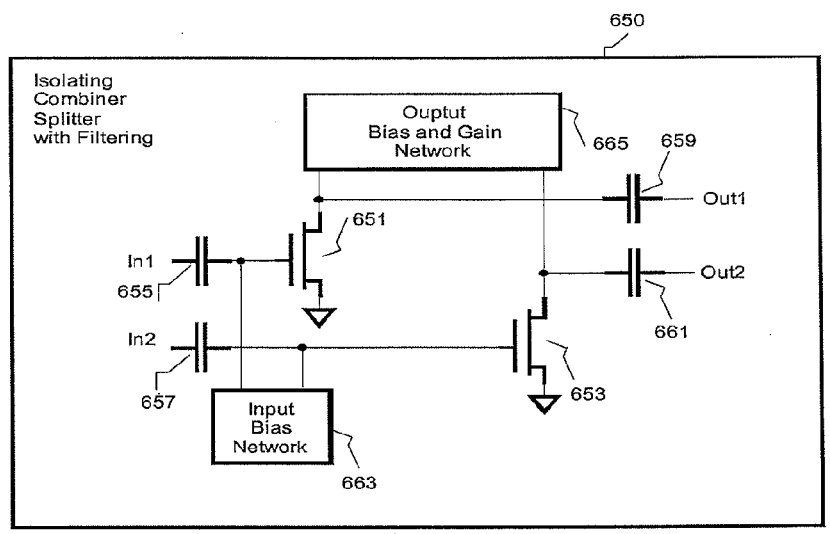
FIG. 19 shows a combiner or splitter configuration with filtering according to an embodiment of the invention.

One example of the isolating combiner splitter, as used in this embodiment, is shown in FIG. 19. It consists of two transistors 651 and 653 which may be FET, MOS or BJT, biased as amplifiers. Where used as combiner it is permissible to combine the capacitors 659 and 661 together in parallel. Where used as a splitter it is permissible to combine capacitors 655 and 657 together in parallel. The purpose of the network is to provide isolation between inputs of a combiner, or alternatively to provide isolation of the outputs of a splitter.

Figure 20:
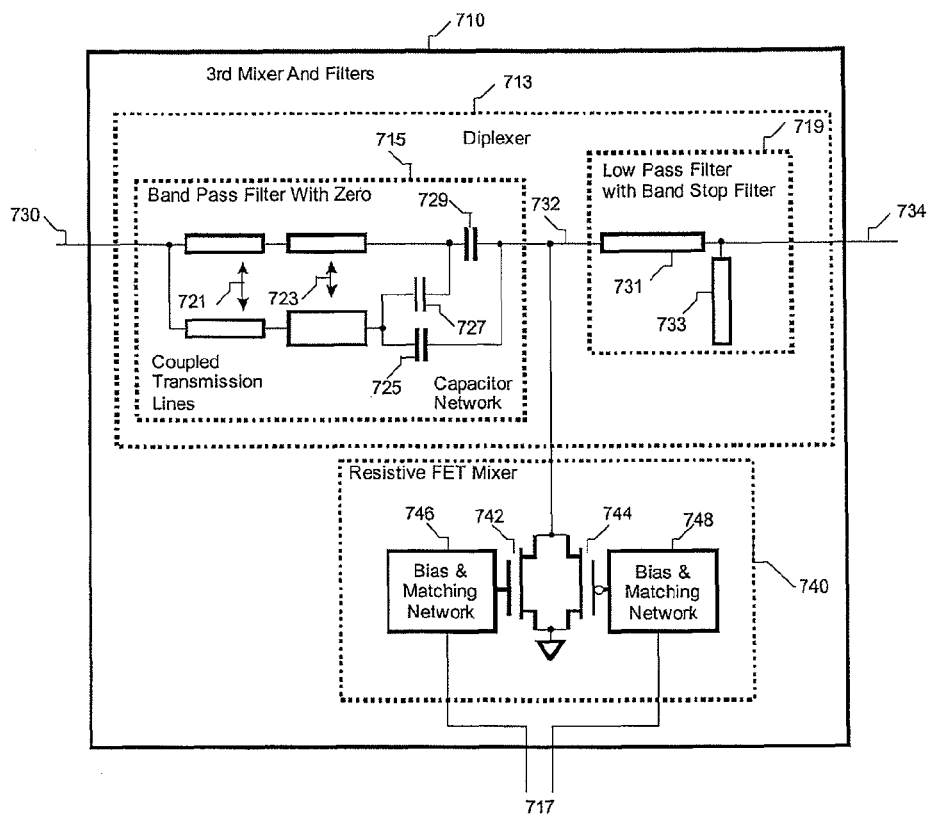
FIG. 20 shows a resistive FET mixer and diplexing filter combination utilizing coupled transmission lines according to an embodiment of the invention.

In the transceiver 10, as an example of a suitable implementation, a combination of the filter 72 third mixer 74 and filter 76 within the transmit block 48 to form a single passive mixer 710 as shown in FIG. 20 is used. Similarly the filter 93 third mixer 95 and filter 97 within the receive block 59 are combined to form a single passive mixer 710. The mixer 710 consists of a diplexing filter 713 and mixer cell 740. The diplexing filter 713 consists of two parts, a band pass filter with zero 715 and a low pass filter with band stop performance 719. The combination of 715 and 719 minimally alter the frequency responses of each other. The band pass filter 715 provides a high impedance block at node 732 over the low frequency range of 719. The low pass filter provides a high impedance block at node 732 over the band pass frequency range of 715. Thus providing a separation of the RF 734 and IF 730 signals. The mixer 710 provides frequency translation between the RF signal 734 and IF signal 730 and is bidirectional.

The low pass with band stop filter 719 consists of two transmission lines 731 and 733. These two transmission lines concurrently provide a high impedance block to the IF signal at node 732, impedance matched low pass filtering of the RF signal 734. This filter can be implemented in any form of transmission line (microstrip, cpw, stripline, slot) on any kind of dielectric, or as a waveguide or lumped element approximation of transmission lines using soldered components or combination thereof. The structures might be used in conjunction with Photonic Band Gap and defected ground structures to further reduce size and improve stopband performance. The transmission lines may also be meandered to reduce size.

The band pass filter 715 consists of two pairs of coupled transmission lines: 721 and 723 and a capacitor network consisting of three capacitors 725, 727 and 729. These form a compact resonator with a zero in the frequency response. Both coupled transmission line pairs 721 and 723 may be asymmetrical in nature and may be different to each other. The values of capacitors 725, 727 and 729 are arbitrary with respect to one another and are chosen to give control over the location of a zero in the frequency response to provide either image rejection of either sideband of the overall mixer 710 or reduction in LO leakage from 717. This filter can be implemented in any form of transmission line (microstrip, cpw, stripline, slot), waveguide or lumped element approximation of transmission line or combination of these. Additionally the capacitor network can be implemented either as soldered components or printed thick, thin film or RFIC structures and may use fixed or variable elements including varactor capacitors. The structures may be used in conjunction with Photonic Band Gap and defected ground structures to further reduce size and improve stopband performance. The transmission lines may be meandered to reduce size. One embodiment of the mixer cell 740 consists of a pair of FETs 742 and 744 implemented in a complementary FET technology (such as CMOS) to form a single balanced resistive FET mixer. The transistors 742 and 744 are driven differentially from a Synthesiser (46 or 57) through bias and matching networks 746 and 748 respectively. Transistors 742 and 744 conduct nominally simultaneously during part of the LO period. The device widths of 742 and 744 are carefully chosen to minimise LO leakage at node 732. Typically the drain connection will include a diplexing filter such as the embodiment of 715 and 719 shown in FIG. 20. One embodiment of the diplexing filter 713 of FIG. 20 is given in FIG. 21. This structure consists of two metal layers 901 and 903. 901 is trace of lower metal forming microstrip filter with 3 ports, port 2 730, port 1 732 and port 3 734. This trace is in two parts, one forming the port 730 and the coupled transmission lines 721, 723, and the other forming ports 732 and 734 and the transmission lines 731 and 733. 903 is a layer of upper metal forming a thin film capacitor network (corresponding with 725, 727, 729 of FIG. 20) which capacitively couples with the lower metal and the stub 723. The upper metal 903 is directly connected to Port 1 through a via 909.

Figure 21:
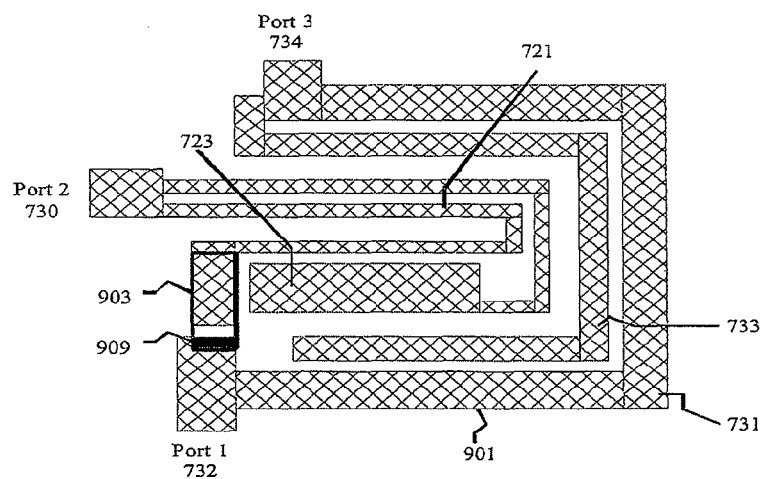
FIG. 21 shows an diplexing filter according to an embodiment of the invention.
Figure 22:
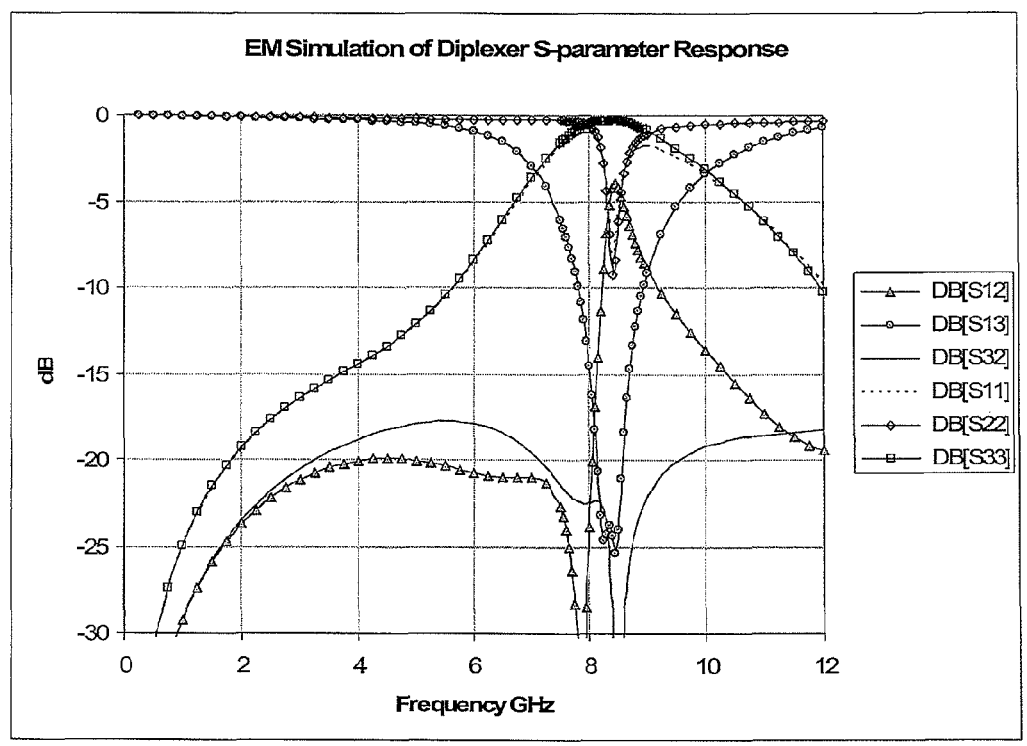
FIG. 22 shows EM simulation of the s-parameter response of the diplexing filter of FIG. 21.

FIG. 22 shows the s-parameter performance of an embodiment of the diplexing filter of FIG. 21. The s-parameter behavior of the diplexer can be divided into the low frequency region and a region around the IF frequency. The low frequency behavior extends from DC to about 6 GHz. In this frequency range, the low frequency port 734 is matched ($s_{33}$<−10 dB), as is the common port 732 ($s_{11}$<−10 dB). Whereas the high frequency port 730 is mismatched ($s_{22}$>−10 dB). Low frequency signals can freely pass in both directions between the low frequency port 734 and the common port 732 ($s_{13}$>−3 dB). The signal transmission between the high frequency port 730 and the common port 732 is substantially blocked ($s_{12}$<−15 dB). At the IF frequency 8.4 GHz, the system reverses its behavior. The low frequency port 734 is no longer matched ($s_{33}$>−10 dB), whereas the high frequency port 730 and the common port 732 are now both matched ($s_{11}$<−10 dB, $s_{22}$<−10 dB). Signals pass in both directions between the high frequency port 730 and the common mode port 732 with only a small loss ($s_{12}$~−5 dB), whereas transmission between the low frequency port and the common port are substantially blocked ($s_{13}$<−15 dB). Just below 8 GHz there is a sharp reduction in the transmission between the common port 732 and high frequency port 730 ($s_{12}$<−15 dB). The frequency of this transmission zero is controlled by the capacitor network 725, 727 and 729 and can be either side of the IF frequency (here 8.4 GHz). This transmission zero is used to improve image rejection and reduce carrier leakage.

The invention claimed is:

1. An RF transceiver apparatus comprising transmitter circuitry arranged to convert signals from a baseband frequency to a range of RF transmission frequencies and receiver circuitry arranged to convert signals from a range of RF reception frequencies to the baseband frequency wherein:
   the transmitter circuitry comprises a first transmitter mixer arranged to convert a signal from the baseband frequency to a first intermediate frequency;
   a second transmitter mixer arranged to convert the signal from the first intermediate frequency to a second intermediate frequency that is higher than the transmission frequencies; and
   a third transmitter mixer arranged to convert the signal from the second intermediate frequency to the transmission frequency; and
   the receiver circuitry comprises a third receiver mixer arranged to convert the RF input from the reception frequency to the second intermediate frequency which is higher than the reception frequency,
   a second receiver mixer arranged to convert the signal from the second intermediate frequency to a first intermediate frequency which is lower than the reception frequency, and
   a first receiver mixer arranged to convert the signal from the first intermediate frequency to the baseband frequency; and
   the second receiver mixer and the second transmitter mixer are both driven by a common second stage fixed frequency synthesizer.

2. Apparatus according to claim 1 wherein the receiver circuitry further comprises first and third receiver synthesizers, and the first and third transmitter mixers are driven by the first and third transmitter synthesizers respectively and the first transmitter synthesizer has finer frequency steps than the third transmitter synthesizer.

3. Apparatus according to claim 1 wherein the transmitter circuitry further comprises first and third transmitter synthesizers, and the first and third transmitter mixers are driven by the first and third transmitter synthesizers respectively and the first transmitter synthesizer has finer frequency steps than the third transmitter synthesizer.

4. Apparatus according to claim 1 further comprising a second stage fixed frequency synthesizer, wherein at least one of the second receiver mixer and the second transmitter mixer is driven by the second stage fixed frequency synthesizer.

5. Apparatus according to claim 1 wherein at least one of the second mixers forms part of a mixer and filter combination arranged to filter the signal at the second intermediate frequency.

6. Apparatus according to claim 1 wherein at least one of the first mixers forms part of a mixer and filter combination arranged to filter the signal at the first intermediate frequency.

7. Apparatus according to claim 1 wherein at least one of the third mixers forms part of a mixer and filter combination arranged to filter the signal at the RF frequency.

8. Apparatus according to claim 1 further comprising a direct digital frequency synthesizer and a digital to analog converter, wherein at least one of the first mixers is driven by the direct digital frequency synthesizer and the digital to analog converter.

9. Apparatus according to claim 8 wherein the direct digital frequency synthesizer comprises a look up table expressing a sine or cosine function in terms of Walsh function coefficients.

10. Apparatus according to claim 8 further comprising a wide band delta sigma modulator arranged to modulate the input to the digital to analog converter, the modulator comprising a quantizer and a plurality of loop filters.

11. A direct digital frequency synthesizer comprising a look up table expressing at least one of a sine function and a cosine function in terms of Walsh function coefficients.

12. A synthesizer according to claim 11, further comprising a phase accumulator arranged to generate a phase signal representing a phase of the sine or cosine function, which is input to the look up table, wherein the look up table is arranged to receive the phase signal and produce an output representing the amplitude of the function and wherein the Walsh function coefficients are selected from the full series of Walsh function coefficients on the basis of their magnitude.

13. A delta sigma modulator apparatus for modulating a digital signal, the modulator comprising a quantizer and a plurality of loop filters, wherein the loop filters form a first feedback loop arranged to generate at least one first difference signal representing the difference between the input and output of the quantizer, and modify the at least one difference signal by a first coefficient factor to provide a first feedback signal, and a second feedback loop arranged to generate at least one second difference signal representing the difference between the input to the modulator and the output of the quantizer and modify the at least one second difference signal by a second coefficient factor to provide a second feedback signal, wherein a series of delay lines is provided between the input to the modulator and the input to the quantizer, and a plurality of first feedback loops are arranged to feed back the first difference signal to a plurality of feedback points separated by the delay lines, the apparatus further comprising a plurality of second feedback loops arranged to feed back the second difference signal to a plurality of feedback points separated by the delay lines, wherein each of the second feedback loops includes delay means arranged to compensate for delay in the delay lines.

14. A delta sigma modulator apparatus for modulating a digital signal, the modulator comprising:
a quantizer;
a plurality of loop filters;
a plurality of feedback input points between the input to the modulator and the input to the quantizer, a set of first feedback sub-sections each associated with one of the feedback points and arranged to:
generate a first difference signal from the difference between the output of the quantizer and the output from its respective feedback input point,
modify the first difference signal, and
input the first difference signal at the respective feedback input point; and
a second set of second feedback sub-sections each associated with one of the feedback points and arranged to:
generate a second difference signal from the difference between the output of the quantizer and the input from its respective feedback input point,
modify the second difference signal, and
input the second difference signal at the respective feedback input point.

15. A delta sigma modulator apparatus for modulating a digital signal, the modulator comprising:
a quantizer;
a plurality of loop filters;
a plurality of feedback input points between the input to the modulator and the input to the quantizer,
a set of first feedback sub-sections each associated with one of the feedback points and each comprising:
a first feedback part arranged to generate a difference signal from the difference between the output of the quantizer and the output from the its respective feedback input point, modify the difference signal, and feed it back to the respective feedback input point; and
a second feedback part arranged to generate a difference signal from the difference between the output of the quantizer and the input from its respective feedback input point, modify the difference signal, and feed it back to the respective feedback input point.

16. A delta sigma modulator apparatus for modulating a digital signal, the modulator comprising:
a quantizer;
a plurality of loop filters, wherein the loop filters are arranged to provide a noise transfer function of the form $$N(z) = \frac{1 - A(z)}{1 + B(z)}.$$

17. A delta sigma modulator apparatus for modulating a digital signal, the modulator comprising:
a quantizer;
a plurality of loop filters, and arranged to utilize a noise transfer function of the general form: $N(z)=(1+2z^{-2}+z^{-4})\cdot(1+1.75^{-2}+z^{-4})$.

18. An apparatus providing frequency shifted single ended output from transformerless differential input, the apparatus comprising three doubly balanced frequency mixers connected through in phase isolating combiner splitters, wherein two of the mixers are arranged to mix in phase and quadrature analogue inputs with in phase and quadrature inputs from an oscillator and output differential in phase and quadrature output signals, wherein there are two in phase isolating combiner splitters arranged to receive as inputs the differential phase and quadrature output signals and generate differential filtered signals, and wherein a third one of the mixers is arranged to mix the differential filtered signals with differential inputs from an oscillator and generate a frequency shifted output signal.

* * * * *